United States Patent
Boukai et al.

(10) Patent No.: US 10,003,004 B2
(45) Date of Patent: Jun. 19, 2018

(54) METHODS FOR FORMING THERMOELECTRIC ELEMENTS

(71) Applicant: Matrix Industries, Inc., Menlo Park, CA (US)

(72) Inventors: Akram I. Boukai, Menlo Park, CA (US); Douglas W. Tham, Menlo Park, CA (US)

(73) Assignee: MATRIX INDUSTRIES, INC., Menlo Park, CA (US)

( * ) Notice: Subject to any disclaimer, the term of this patent is extended or adjusted under 35 U.S.C. 154(b) by 0 days. days.

(21) Appl. No.: 14/700,082

(22) Filed: Apr. 29, 2015

(65) Prior Publication Data
US 2015/0325772 A1    Nov. 12, 2015

Related U.S. Application Data

(63) Continuation of application No. PCT/US2013/067346, filed on Oct. 29, 2013.
(Continued)

(51) Int. Cl.
*H01L 21/00* (2006.01)
*H01L 35/34* (2006.01)
(Continued)

(52) U.S. Cl.
CPC .............. *H01L 35/34* (2013.01); *H01L 35/32* (2013.01); *H01L 21/02019* (2013.01);
(Continued)

(58) Field of Classification Search
CPC ................................ H01L 35/34; H01L 35/32
(Continued)

(56) References Cited

U.S. PATENT DOCUMENTS

| | | |
|---|---|---|
| 365,990 A | 7/1887 | Giles |
| 3,653,989 A | 4/1972 | Widmer |

(Continued)

FOREIGN PATENT DOCUMENTS

| | | |
|---|---|---|
| CN | 1382626 A | 12/2002 |
| JP | S63266829 A | 11/1988 |

(Continued)

OTHER PUBLICATIONS

Notice of allowance dated Oct. 8, 2015 for U.S. Appl. No. 14/667,177.
(Continued)

*Primary Examiner* — Vu A Vu
(74) *Attorney, Agent, or Firm* — Wilson Sonsini Goodrich & Rosati

(57) ABSTRACT

The present disclosure provides a method for forming a thermoelectric device, comprising providing a semiconductor substrate and providing a first layer of an etching material adjacent to the semiconductor substrate. The etching material facilitates the etching of the semiconductor substrate upon exposure to an oxidizing agent and a chemical etchant. Next, a second layer of a semiconductor oxide is provided adjacent to the first layer, and the second layer is patterned to form a pattern of holes or wires. The second layer and first layer are then sequentially etched to expose portions of the semiconductor substrate. Exposed portions of the semiconductor substrate are then contacted with an oxidizing agent and a chemical etchant to transfer the pattern to the semiconductor substrate.

18 Claims, 18 Drawing Sheets

Related U.S. Application Data

(60) Provisional application No. 61/720,972, filed on Oct. 31, 2012.

(51) Int. Cl.
*H01L 35/32* (2006.01)
*H01L 21/306* (2006.01)
*H01L 21/3213* (2006.01)
*H01L 21/3063* (2006.01)
*H01L 21/04* (2006.01)
*H01L 21/302* (2006.01)
*H01L 21/02* (2006.01)
*H01L 21/3105* (2006.01)

(52) U.S. Cl.
CPC ........ *H01L 21/0475* (2013.01); *H01L 21/302* (2013.01); *H01L 21/306* (2013.01); *H01L 21/3063* (2013.01); *H01L 21/30604* (2013.01); *H01L 21/30608* (2013.01); *H01L 21/30621* (2013.01); *H01L 21/30625* (2013.01); *H01L 21/31055* (2013.01); *H01L 21/32133* (2013.01); *H01L 21/32135* (2013.01)

(58) Field of Classification Search
USPC .......................................................... 438/54
See application file for complete search history.

(56) References Cited

U.S. PATENT DOCUMENTS

| | | |
|---|---|---|
| 4,070,821 A | 1/1978 | Somogyi |
| 4,078,945 A | 3/1978 | Gonsiorawski |
| 4,092,445 A | 5/1978 | Tsuzuki et al. |
| 4,106,279 A | 8/1978 | Martin et al. |
| 4,261,049 A | 4/1981 | Komiyama et al. |
| 4,681,657 A * | 7/1987 | Hwang ............ H01L 21/30604 252/79.3 |
| 4,985,722 A | 1/1991 | Ushijima et al. |
| 5,089,293 A | 2/1992 | Bohara et al. |
| 5,139,624 A | 8/1992 | Searson et al. |
| D332,408 S | 1/1993 | Chodat et al. |
| 5,206,523 A | 4/1993 | Goesele et al. |
| D365,767 S | 1/1996 | Hitter |
| 5,552,328 A | 9/1996 | Orlowski et al. |
| 5,565,084 A | 10/1996 | Lee et al. |
| 5,695,557 A | 12/1997 | Yamagata et al. |
| 5,767,020 A | 6/1998 | Sakaguchi et al. |
| 5,868,947 A | 2/1999 | Sakaguchi et al. |
| 5,873,003 A | 2/1999 | Inoue et al. |
| 5,889,735 A | 3/1999 | Kawata et al. |
| 5,895,223 A | 4/1999 | Peng et al. |
| D409,097 S | 5/1999 | Monachon |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,194,323 B1 * | 2/2001 | Downey ........... H01L 21/31116 216/47 |
| 6,304,520 B1 | 10/2001 | Watanabe |
| 6,304,521 B1 | 10/2001 | Kanesaka |
| 6,313,015 B1 | 11/2001 | Lee et al. |
| 6,407,965 B1 | 6/2002 | Matoge et al. |
| 6,762,134 B2 | 7/2004 | Bohn et al. |
| 6,790,785 B1 | 9/2004 | Lin et al. |
| 6,803,260 B2 | 10/2004 | Shin et al. |
| 6,882,051 B2 | 4/2005 | Majumdar et al. |
| D504,624 S | 5/2005 | Bodino |
| 7,075,161 B2 | 7/2006 | Barth |
| 7,115,971 B2 | 10/2006 | Stumbo et al. |
| 7,135,728 B2 | 11/2006 | Duan et al. |
| 7,161,168 B2 | 1/2007 | Heath et al. |
| D536,994 S | 2/2007 | Sugisawa et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,569,941 B2 | 8/2009 | Majumdar et al. |
| 7,572,669 B2 | 8/2009 | Tuominen et al. |
| 7,629,531 B2 | 12/2009 | Stark |
| 7,645,625 B2 | 1/2010 | Ono et al. |
| 7,675,084 B2 | 3/2010 | Wierer, Jr. et al. |
| 7,960,258 B2 | 6/2011 | Chao et al. |
| D646,183 S | 10/2011 | De Witt |
| 8,087,254 B2 | 1/2012 | Arnold |
| 8,101,449 B2 | 1/2012 | Liang et al. |
| 8,278,191 B2 | 10/2012 | Hildreth et al. |
| 8,324,699 B2 | 12/2012 | Ichijo et al. |
| 8,486,843 B2 | 7/2013 | Li et al. |
| 8,641,912 B2 | 2/2014 | Heath et al. |
| 8,980,656 B2 * | 3/2015 | Li ........................... B82Y 10/00 257/E33.005 |
| D729,638 S | 5/2015 | Favre |
| 9,065,016 B2 | 6/2015 | Peter et al. |
| D736,103 S | 8/2015 | Behling |
| D744,866 S | 12/2015 | Behling |
| 9,209,375 B2 | 12/2015 | Boukai et al. |
| 9,263,662 B2 | 2/2016 | Boukai et al. |
| D752,045 S | 3/2016 | Kim et al. |
| 9,515,246 B2 * | 12/2016 | Boukai ................. H01L 35/34 |
| 2004/0152240 A1 | 8/2004 | Dangelo |
| 2005/0133254 A1 | 6/2005 | Tsakalakos |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0258213 A1 | 11/2007 | Chen et al. |
| 2007/0277866 A1 | 12/2007 | Sander et al. |
| 2008/0019876 A1 | 1/2008 | Chau et al. |
| 2008/0112669 A1 | 5/2008 | Choi et al. |
| 2008/0173344 A1 | 7/2008 | Zhang et al. |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0069045 A1 | 3/2009 | Cheng |
| 2009/0117741 A1 | 5/2009 | Heath et al. |
| 2010/0035163 A1 | 2/2010 | Kobrin |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0248449 A1 | 9/2010 | Hildreth et al. |
| 2011/0003279 A1 | 1/2011 | Patel |
| 2011/0114145 A1 | 5/2011 | Yang et al. |
| 2011/0114146 A1 | 5/2011 | Scullin |
| 2011/0168978 A1 | 7/2011 | Kochergin |
| 2011/0179806 A1 | 7/2011 | Ipposhi et al. |
| 2011/0215441 A1 | 9/2011 | Lin et al. |
| 2011/0263119 A1 * | 10/2011 | Li ...................... H01L 21/30604 438/653 |
| 2011/0266521 A1 | 11/2011 | Ferrari et al. |
| 2012/0097204 A1 | 4/2012 | Yu et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0174956 A1 | 7/2012 | Smythe et al. |
| 2012/0217165 A1 | 8/2012 | Feng et al. |
| 2012/0282435 A1 | 11/2012 | Yang et al. |
| 2012/0290051 A1 | 11/2012 | Boyden et al. |
| 2012/0295074 A1 | 11/2012 | Yi et al. |
| 2012/0319082 A1 | 12/2012 | Yi et al. |
| 2012/0326097 A1 | 12/2012 | Ren et al. |
| 2013/0019918 A1 | 1/2013 | Boukai et al. |
| 2013/0052762 A1 | 2/2013 | Li et al. |
| 2013/0087180 A1 | 4/2013 | Stark et al. |
| 2013/0143407 A1 * | 6/2013 | Lin ........................... B81C 1/0038 438/694 |
| 2013/0175484 A1 | 7/2013 | Ren et al. |

(56) References Cited

U.S. PATENT DOCUMENTS

| | | |
|---|---|---|
| 2013/0186445 A1 | 7/2013 | Lorimer et al. |
| 2014/0117380 A1 | 5/2014 | Loboda et al. |
| 2014/0299169 A1 | 10/2014 | Schneider et al. |
| 2014/0306250 A1 | 10/2014 | Gardner et al. |
| 2014/0326287 A1 | 11/2014 | Wiant et al. |
| 2014/0373888 A1 | 12/2014 | Boukai et al. |
| 2015/0083180 A1 | 3/2015 | Lang |
| 2015/0101788 A1 | 4/2015 | Smith et al. |
| 2015/0162517 A1 | 6/2015 | Kasichainula |
| 2015/0179911 A1 | 6/2015 | Lemmer et al. |
| 2015/0216718 A1 | 8/2015 | Diller et al. |
| 2015/0228883 A1 | 8/2015 | Boukai et al. |
| 2015/0280099 A1 | 10/2015 | Boukai et al. |
| 2016/0035956 A1 | 2/2016 | Carroll et al. |
| 2016/0056360 A1 | 2/2016 | Cho et al. |
| 2016/0197259 A1 | 7/2016 | Boukai et al. |

FOREIGN PATENT DOCUMENTS

| | | |
|---|---|---|
| JP | 2004193526 A | 7/2004 |
| JP | 2006261451 A | 9/2006 |
| JP | 2007300127 A | 11/2007 |
| JP | 2010192580 A | 9/2010 |
| JP | 2010537430 A | 12/2010 |
| JP | 2004-193526 A | 7/2014 |
| WO | WO-0102556 A3 | 8/2001 |
| WO | WO 02/23607 A1 | 3/2002 |
| WO | WO 2010/003629 A2 | 1/2010 |
| WO | WO 2011/049804 A2 | 4/2011 |
| WO | WO-2012068426 A2 | 5/2012 |
| WO | WO-2013012842 A1 | 1/2013 |
| WO | WO 2013/109729 A1 | 7/2013 |
| WO | WO 2014/028903 A1 | 2/2014 |
| WO | WO-2014070795 A1 | 5/2014 |
| WO | WO 2014/179622 A1 | 11/2014 |
| WO | WO 2015/134394 A1 | 9/2015 |

OTHER PUBLICATIONS

Office action dated Aug. 28, 2015 for U.S. Appl. No. 13/550,424.
Notice of allowance dated Nov. 6, 2015 for U.S. Appl. No. 14/667,177.
Office action dated Nov. 17, 2015 for U.S. Appl. No. 14/372,443.
Office action dated Nov. 18, 2015 for U.S. Appl. No. 13/278,074.
Wolfsteller; et al., Comparison of the top-down and bottom-up approach to fabricate nanowire-based silicon/germanium heterostructures. Thin Solid Films 518.9 (2010): 2555-2561.
"Chen, et al. Dispenser Printed Microscale Thermoelectric Generators for Powering Wireless Sensor Networks. Paper No. IMECE2009-11636, pp. 343-352; 10 pages."
Co-pending U.S. Appl. No. 14/989,225, filed Jan. 6, 2016.
European search report and opinion dated Feb. 26, 2016 for EP Application No. 13829134.9.
"Notice of allowance dated Jan. 22, 2016 for U.S. Appl. No. 14/667,177."
"Notice of allowance dated Dec. 10, 2015 for U.S. Appl. No. 14/667,177."
Notice of allowance dated Jul. 29, 2016 for U.S. Appl. No. 14/624,506.
Office action dated Oct. 7, 2016 for U.S. Appl. No. 14/989,225.
U.S. Appl. No. 14/624,506, filed Feb. 17, 2015, Boukai et al.
U.S. Appl. No. 14/667,177, filed Mar. 24, 2015, Boukai et al.
Agnes, et al. Doping of the nanocrystalline semiconductor zinc oxide with the donor indium, Amer Institute of Phystcs, vol. 83, No. 6, 1204, (Aug. 11, 2003).
Beckman, et al. Fabrication of Conducting. Silicon nanowire Arrays, J. Appi. Phys. 96 (10), 5921-5923(2004).
Beckman, et al., Bridging Dimensions: Demultiplexing Ultrahigh-Density nanowire Circuits, Science 2005, 310: 465-468.
Behnen. Quantitative examination of the thermoelectric power of n-typesilicon in the phono drag regime.Journal of Applied Physics, vol. 67, pp. 287-292, Jan. 1, 1990.

Bera, et al. Marked Effects of Alloying on the Thermal Conductivity of nanoporous Materials, Mar. 19, 2010, American Physical Society Physical Review Letters, 104, pp. 115502-01 to 115502-4.
Boukai, et al. Silicon nanowires as efficient thermoelectric materials. nature, vol. 451, pp. 168-171, Jan. 10, 2008.
Boukai, et al. Size-Dependent transport and thermoelectric properties of individual polycrystalline bismuth nanowires. Advanced Materials, 18, pp. 864-869, 2006.
Boukai. Thermoelectric properties of bismuth and silicon nanowires. Dissertation (Ph.D.), California Institute of Technology. 2008.
Bunimovich, et al. Quantitative Real-Time Measurements of DnA Hybridization with Alkylated nonoxidized Silicon nanowires in Electrolyte Solution, JACS 2006, 128: 16323-16331.
Chadwick, et al. Plane waves in an elastic solid conducting heat. Journal of the Mechanics and Physics of Solids 6, 223-230 (1958).
Chen, et al. Recent developments in thermoelectric materials. International Materials Reviews, vol. 48, pp. 4566, 2003.
Choi, et al. Fabrication of bismuth nanowires with a silver nanocrystal shadowmask, J. Vac. Sci. Tech. A—Vac. Surf. and Films, 18, 1236, 1328 (2000).
Choi, et al. Fabrication of nanometer size photoresist wire patterns With a silver nanocrystal shadowmask. J. Vac. Sci. & Tech. A—Vac. Surf. and Films, 17, 1425 (1999).
Chung, et al. Fabrication and Alignment of Wires in Two-Dimensions. The Journal of PhysiCal Chemistry B. 102. 6685 (1998).
Collier, et al. Nanocrystal superlattices. Annu. Rev. Phys. Chem. 1998, 49: 371-404.
Deresiewicz. Plane waves in a thermoelastic solid. Journal of the Acoustical Society of America 29, 204-209 (1957).
Diehl, et al. Self-Assembly of Deterministic Carbon nanottibe Wiring networks. Angew. Chem. Int Ed. 41, 353 (2002).
European search report and opinion dated Mar. 25, 2014 for EP Application No. 11835180.8.
Fan, et al. Self-Oriented Regular Arrays of Carbon nanotubes and their Field Emission Devices. Science, v. 283, p. 512 (Jan. 22, 1999).
Geballe, et al. Seebeck Effect in Silicon. Physical Review, vol. 98, pp. 940-947, May 15, 1955.
Green, et al., A 160-kilobit molecular electronic memory patterned at 1011 bits per square centimeter, nature 2007, 445: 414-417.
Gurevich. Thermoelectric properties of conductors J. Phys. (U.S.S. R.) 9, 477 (1945).
Harman, et al. Quantum dot superlattice thermoelectric materials and devices. Science, vol. 297, pp. 22292232, Sep. 27, 2002.
Haynes, et al. nanosphere Lithography: A Versatile nanofabrication Tool for Studies of Size-Dependent nanoparticle Optics. J. Phys. Chem. B, 105, 5599-5611 (2001).
Heath, et al. A Defect-Tolerant Computer Architecture: Opportunities for nanotechnology, Science 1998, 280: 1716-1721.
Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.
Herring. Theory of the thermoelectric power of semiconductors. Physical Review, vol. 96, No. 5, pp. 11631187, 1954.
Hicks, et al.. Thermoelectric figure of merit of a one-dimensional conductor. Physical Review B 47, 1 6631-1 6634 (1993).
Hochbaum, et al. Enchanced thermoelectric performance of rough silicon nanowires, Jan. 2008, nature Publishing Group, vol. 451, pp. 1-6.
Hsu, et al. Cubic AgPbmSbTe2+m: Bulk thermoelectric materials with high Figure of Merit. Science, vol. 303, pp. 818-821, Feb. 6, 2004.
Huang, et al. Metal-assisted chemical etching of silicon: a review. Adv Mater. Jan. 11, 2011;23(2):285-308. doi: 10.1002/adma. 201001784.
Huang, et al. Spontaneous formation of nanoparticle strip patterns through dewetting. nature Materials vol. 4, p. 896 (2005).
Hulteen, et al. nanosphere lithography: A materials general fabrication process for periodic particle array surfaces, J. Vac. Sci. Technol. 1995, 13: 1553-1558.

(56) References Cited

OTHER PUBLICATIONS

Humphrey, et al. Reversible thermoelectric nanomaterials. Physical Review Letters 94, 096601 (2005).
Husain, et al. Nanowire-based very-high-frequency electromechanical resonator. Applied physics letters, vol. 83, No. 6, Aug. 11, 2003, pp. 1240-1242.
Ihab, et al. Manipulation of thermal phonons: a phononic crystal route to high-ZT thermoelectrics. Photonic and Phononic Properties of Engineered nanostructures, SPIE. 1000 20th St. Bellingham, WA 98225-6705. Feb. 10, 2011; 7946:1-9.
International search report and written opinion dated Feb. 9, 2009 for PCT/US2008/070309.
International search report and written opinion dated Apr. 15, 2009 for PCT/US2008/064439.
International search report and written opinion dated Apr. 26, 2013 for PCT/US2013/021900.
International search report and written opinion dated May 29, 2012 for PCT/US2011/057171.
International search report and written opinion dated Jul. 17, 2012 for PCT Application No. PCT/US2012/047021.
International search report and written opinion dated Dec. 27, 2013 for PCT/US2013/055462.
International search report dated Feb. 10, 2014 for PCT/US2013/067346.
International search report and written opinion dated Jul. 3, 2015 for PCT Application No. US2015/022312.
Joannopoulos, et al. Photonic crystals: putting a new twist on light, nature 1997, 386: 143-149.
Jung, et al. Circuit Fabrication at 17 nm Half-Pitch by nanoimprint-tithography. nanoLetters, 6, 351 (2006).
Koga, et al. Experimental proof-of-principle investigation of enhanced Z3DT in (100) oriented Si/Ge superlattices. Applied Physics Letters 77, 1490-1492 (2000).
Lee, et al nanoporous Si as an Efficient Thermoelectric Material. nano Letter, 8, 2008, 3750-3754.
Lee, et al. Enhanced thermoelectric figure-of-merit in nanostructured p-type silicon germanium bulk alloys. nano. Lett. 2008; 8(12):4670-4674.
Lee, et al. nanostructured bulk thermoelectric materials and their properties. ICT 2005. 24th International Conference on Thermoelectrics (ICT). 2005 284-287.
Li, et al. Measuring thermal and thermoelectric properties of one-dimensional nanostructures using a microfabricated device. Journal of heart transfer, vol. 125, pp. 881-888, Oct. 2003.
Li, et al. Thermal conductivity of individual silicon nanowires. Applied Physics Letters, vol. 83, pp. 2934-2936, Oct. 6, 2003.
Lifshitz, et al. Thermoelastic damping in micro- and nanomechanical systems. Physical Review B 61, 5600-5609 (2000).
Liu, et al. Thermal conduction in ultrahigh pure and doped single-crystal silicon layers at high temperatures. Journal of Applied Physics 98, 123523 (2005).
Llaguno, et al. Observation of thermopower oscillations in the coulomb blockade regime in a semiconducting carbon nanotube. nano Lett. 4, 45-49 (2004).
Mahan, et al. The best thermoelectric. PnAS 93, 7436-7439 (1996).
Mahan, et al. Thermoelectric materials: new approaches to an old problem. Physics Today 50, pp. 42-47, Mar. 1997.
Majumdar. Thermoelectricity in Semiconductor nanostructures. Science Feb. 6, 2004; 303(5659):777-778. DOI: 10.1126/science.1093164.
Maranganti, et al. Length scales at which classical elasticity breaks down for various materials. Physical Review Letters 98, 195504 (2007).
Martin. nanomaterials—A membrane based synthetic approach. Science, v. 266, p. 1961-1966 (Dec. 23, 1994).
Melosh, et al. Ultra-high density nanowire lattices and circuits. Science, vol. 300, pp. 112-115,Apr. 4, 2003.
Morales, et al. A laser ablation method for the synthesis of semiconductor crystalline nanowires. Science, vol. 279, pp. 208-211, Jan. 9, 1998.

NDT Resource Center, Thermal Conductivity. Downloaded Nov. 26, 2013. https://www.nde-ed.org/EducationResources/CommunityCollege/Materials/Physical_Chemical/ThermalConductivity.htm.
Notice of allowance dated Jul. 13, 2011 for U.S. Appl. No. 12/125,043.
Notice of allowance dated Jul. 29, 2015 for U.S. Appl. No. 12/175,027.
Notice of allowance dated Oct. 2, 2013 for U.S. Appl. No. 12/125,043.
Office action dated Jan. 9, 2015 for U.S. Appl. No. 12/175,027.
Office action dated Jan. 23, 2015 for U.S. Appl. No. 13/278,074.
Office action dated Feb. 12, 2015 for U.S. Appl. No. 13/550,424.
Office action dated Feb. 18, 2011 for U.S. Appl. No. 12/125,043.
Office action dated Apr. 25, 2013 for U.S. Appl. No. 13/278,074.
Office action dated May 23, 2013 for U.S. Appl. No. 12/175,027.
Office action dated Jun. 16, 2015 for U.S. Appl. No. 13/278,074.
Office action dated Jun. 22, 2011 for U.S. Appl. No. 12/175,027.
Office action dated Jun. 30, 2014 for U.S. Appl. No. 12/175,027.
Office action dated Jul. 18, 2014 for U.S. Appl. No. 13/278,074.
Office action dated Aug. 7, 2013 for U.S. Appl. No. 13/278,074.
Office action dated Nov. 10, 2010 for U.S. Appl. No. 12/175,027.
Office action dated Nov. 27, 2013 for U.S. Appl. No. 12/175,027.
Pearson. Survey of thermoelectric studies of the group-1 metals at low temperatures carried out at the national-research-laboratories, Ottawa. Soviet Physics-Solid State 3, 1024-1033 (1961).
Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Sialon Ceramics. Downloaded May 6, 2013. http://www.sailon.com.au/high-temperature-seebeck-probes.htm.
Silverstein, et al. Porous polymers. John Wiley & Sons, 2011.
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
Venkatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.
Wang, et al. A new type of lower power thermoelectric microgenerator fabricated by nanowire array thermoelectric material. Microelectronic Engineering. 2005; 77:223-229.
Wang, et al. Complementary Symmetry Silicon nanowire Logic: Power-Efficient Inverters with Gain, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).

(56) References Cited

OTHER PUBLICATIONS

Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Wang, et al., Silicon p-FETs from Ultrahigh Density nanowire Arrays, nano Letters 2006, 6: 1096-1100.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5, 256-269 (1996).
Wu, et al. Single-crystal metallic nanowires and meta semiconductor nanowires heterostructures. nature, 430. p. 61(2004).
Xu, et al. Controlled fabrication of long quasione-dimensional superconducting nanowire arrays. nano letters, vol. 8, No. 1, Dec. 6, 2007, pp. 136-141.
Yablonovitch. Photonic band-gap structures, J. Opt. Soc. Am. B. 1993, 10: 283-297.
Yang, et al. Encoding Electronic Properties.By Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.
Yang, et al. Thermal conductivity of simple and tubular nanowire composites in the longitudinal direction. Physiucal Review B, 72, 125418, 2005, p. 1-7.
Yu, et al. Reduction of thermal conductivity in phononic nanomesh structures. nature nanotechnology. 2010; 5:718-721.
Yu-Ming, et al. Semimetal-semicinductor transition in bil_xSbx alloy nanowires and their thermoelectric properties. Applied Physics Letter, vol. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. Nanowire Crossbar Arrays as Address Decoders for Integrated nanosystems, Science 2003, 302: 1377-1379.
Zhou, et al. Verticaly aligned Zn2SiO4 nanotube/ZnO nanowire Heterojunction Arrays. Small, v.3. p. 622-626 (2007).
Zhou. Determination of transport properties in chromium disilicide nanowires via combined thermoelectric and structural characterizations. nano Letters 7, 1649-1654 (2007).
Notice of allowance dated Jun. 15, 2016 for U.S. Appl. No. 13/278,074.
Office action dated Jun. 23, 2016 for U.S. Appl. No. 14/372,443.
Office action dated Jun. 28, 2016 for U.S. Appl. No. 14/624,506.
Office action dated Jun. 29, 2016 for U.S. Appl. No. 13/550,424.
Sialon Ceramics. Downloaded May 6, 2013. http://www.sialon.com.au/high-temperature-seebeck-probes.htm.
Co-pending U.S. Appl. No. 15/585,376, filed May 3, 2017.
Co-pending U.S. Appl. No. 29/584,211, filed Nov. 11, 2016.
International search report and written opinion dated Apr. 7, 2017 for PCT Application No. US-201664501.
Office action dated Apr. 19, 2017 for U.S. Appl. No. 14/372,443.
Office action dated Jun. 26, 2017 for U.S. Appl. No. 14/989,225.
Heat sinks heat spreaders peltier coolers, novel concepts, Inc., 2014, Available at novelconceptsinc.com, http://www.novelconceptsinc.com/heat-spreaders.htm, accessed on Aug. 21, 2017, 2 pages.
International search report and written opinion dated Aug. 7, 2017 for PCT Application US-201730868.
Advisory action dated Jul. 21, 2017 for U.S. Appl. No. 14/372,443.
Office Action dated Jan. 16, 2018 for U.S. Appl. No. 14/989,225.
Office Action dated Jan. 17, 2018 for U.S. Appl. No. 14/372,443.
U.S. Appl. No. 29/584,211 Notice of Allowance dated Jan. 26, 2018.

* cited by examiner

METHODS FOR FORMING THERMOELECTRIC ELEMENTS

CROSS-REFERENCE

This application is a continuation application of PCT/US2013/067346, filed Oct. 29, 2013, which claims priority to U.S. Provisional Patent Application Ser. No. 61/720,972, filed Oct. 31, 2012, each of which is entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2\sigma/k$, where 'S' is the Seebeck coefficient, '$\sigma$' is the electrical conductivity, and 'k' is thermal conductivity. Z is typically employed as the indicator of the COP and the efficiency of thermoelectric devices—that is, COP scales with Z. A dimensionless figure-of-merit, ZT, may be employed to quantify thermoelectric device performance, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with a small figure-of-merit limits their applications in providing efficient thermoelectric cooling.

SUMMARY

Recognized herein is a need for enhanced thermoelectric materials and systems and methods for their fabrication.

The disclosure provides thermoelectric devices and methods for forming thermoelectric devices. In some embodiments, a thermoelectric device comprises a semiconductor substrate having a mesh (e.g., a plurality of holes) disposed between electrodes of the thermoelectric device. Holes included in the mesh can have dimensions on the order of nanometers to micrometers. In some cases, the holes can be filled with a metallic material, semiconductor, or insulator to provide inclusions. The inclusions can have dimensions on the order of nanometers to micrometers.

In some situations, thermoelectric device performance can be dependent on the uniformity of holes defining a mesh. Mesh uniformity can depend, at least in part, on the method used to form the mesh. Provided herein are systems and methods for enabling the formation of a uniform mesh.

In some cases, a thermoelectric device is provided having a semiconductor substrate and an array of nanostructures, such as wires (or nanowires) or holes. The nanostructures can have a high aspect ratio, such as at least 10:1, 100:1, 1000:1, 10,000:1, 100,000:1, 1,000,000:1, or higher, and can be monodisperse. In some cases, the nanostructures are anchored to a semiconductor substrate, such as a silicon substrate.

An aspect of the disclosure provides a method for forming a thermoelectric device, comprising providing a multi-phase alloy having first solid state material and a second solid state material, wherein the second solid state material is phase separated from the first solid state material into one or more domains of the second solid state material. The second solid state material is then selectively removed in relation to the first solid state material to yield one or more inclusions corresponding to the one or more domains of the second solid state material.

Another aspect provides a method for forming a thermoelectric device, comprising providing a mask adjacent to a substrate, the mask having a polymeric mixture. A template having a first pattern is brought in contact with the mask to define a second pattern in the mask, the second pattern comprising holes exposing portions of the substrate. A layer of a metallic material is deposited adjacent to the mask and exposed portions of the substrate. The mask having the layer of metallic material is then removed to provide particles of the metallic material adjacent to the substrate. Inclusions (e.g., holes or cylinders) are then formed in the substrate with the aid of the metallic material.

Another aspect provides a method for forming a thermoelectric device, comprising immersing at least a portion of a solid state material in a solution comprising an emulsion of particles of a metallic material; removing the immersed portion of the solid state material from the solution to provide particles of the metallic material adjacent to the substrate; and forming holes or cylinders in the substrate with the aid of the metallic material.

Another aspect provides a method for forming a thermoelectric device, comprising providing a photoresist adjacent to a substrate; exposing portions of the photoresist to electromagnetic radiation; removing exposed portions of the photoresist to define a pattern comprising holes in the photoresist, the holes exposing portions of the substrate; depositing a layer of a metallic material adjacent to the photoresist and exposed portions of the substrate; removing the photoresist having the layer of metallic material formed thereon to provide particles of the metallic material adjacent to the substrate; and forming holes or cylinders in the substrate with the aid of the metallic material.

Another aspect of the present disclosure provides a method for forming a thermoelectric device, comprising (a) providing a semiconductor substrate; (b) providing a first layer of an etching material adjacent to the semiconductor substrate, wherein the etching material facilitates the etching of the semiconductor substrate upon exposure to an oxidizing agent and a chemical etchant; (c) providing a second layer of a semiconductor oxide adjacent to the first layer; (d) patterning the second layer to form a pattern of holes or wires; (e) sequentially etching the second layer and the first layer to expose portions of the semiconductor substrate; and (f) contacting exposed portions of the semiconductor substrate to an oxidizing agent and a chemical etchant to transfer the pattern to the semiconductor substrate. In an embodiment, (d) comprises forming a pattern of holes. In another embodiment, the method further comprises, between (c) and (d): providing a third layer of an etch block material adjacent to the second layer; and patterning the third layer to form the pattern of holes. In another embodiment, (e) further comprises etching the second and the first layer at a higher rate than the etch block material. In another embodiment, the etch block material comprises one or more of chromium, tungsten, molybdenum, tungsten, titanium and niobium. In another embodiment, the etching layer comprises one or more of gold, silver, platinum, chromium, molybdenum, tungsten and palladium. In another embodiment, the semiconductor substrate is formed of silicon. In another embodiment, the semiconductor substrate is doped n-type or p-type. In another embodiment, (f) further comprises applying a negative potential bias across the semiconductor substrate while contacting exposed portions of the semiconductor substrate to the oxidizing agent and the chemical etchant. In another embodiment, the oxidizing agent is selected from the group consisting of $O_2$, $O_3$, $NO_2$ and $H_2O_2$. In another embodiment, the vapor chemical etchant is selected from the group consisting of HF, HCl, HBr and HI. In another embodiment, in (e), the second layer and the first layer are etched by exposing portions of the second layer and the first layer to energized ions. In another embodiment, in (e), the second layer and the first layer are etched by reactive-ion etching. In another embodiment, the method further comprises doping the semiconductor substrate n-type or p-type subsequent to (f). In another embodiment, the semiconductor substrate is doped n-type or p-type prior to (f). In another embodiment, (f) further comprises forming holes in or wires from the semiconductor substrate, which holes or wires have aspect ratios of at least about 100-to-1. In another embodiment, (f) further comprises forming holes in or wires from the semiconductor substrate, which holes or wires have aspect ratios of at least about 100-to-1. In another embodiment, (f) is performed while applying an electrical potential to the semiconductor substrate. In another embodiment, (f) is performed without an electrical potential applied to the semiconductor substrate. In another embodiment, in (f) the semiconductor substrate is etched at a rate of at least about 0.1 nanometers/second.

Another aspect of the present disclosure provides a method for forming a thermoelectric device, comprising: bringing a first semiconductor substrate adjacent to a second semiconductor substrate; and bonding the first semiconductor substrate to the second semiconductor substrate, wherein each of the first and second semiconductor substrates includes holes or wires having aspect ratios of at least about 10-to-1. In an embodiment, the aspect ratios are at least about 100-to-1. In another embodiment, the aspect ratios are at least about 1000-to-1. In another embodiment, each of the semiconductor substrates comprises primary and secondary pores at a ratio of at least about 10:1. In another embodiment, the bonding comprises: forming OH groups on a surface of each of the first and second semiconductor substrates; bringing an OH covered surface of the first semiconductor substrate in contact with a surface of the second semiconductor substrate; and applying pressure and/or heat to the first and second semiconductor substrates. In another embodiment, the bonding comprises: providing an intermediate layer between the first and second semiconductor substrates; and pressing the first substrate against the second substrate. In another embodiment, the intermediate layer is layer of a semiconductor oxide. In another embodiment, the bonding comprises applying an electrostatic voltage across the first and second semiconductor substrate. In another embodiment, the first and second semiconductor substrates comprise silicon.

Another aspect of the present disclosure provides a method for forming a thermoelectric device, comprising: (a) forming a mask adjacent to a substrate, the mask having three-dimensional structures phase-separated in a polymer matrix; (b) removing the three-dimensional structures, thereby providing a plurality of holes in the polymer matrix, which holes expose portions of the substrate; (c) depositing a layer of a metallic material adjacent to the mask and exposed portions of the substrate; and (d) exposing the substrate to an oxidizing agent and a chemical etchant while applying an electrical potential to the substrate, thereby forming holes in or wires from the substrate, which holes or wires have an aspect ratio of at least about 20:1, wherein surfaces of the substrate exposed by the holes or wires have a roughness between about 0.5 nanometers (nm) and 50 nm across the holes or wires as measured by transmission electron microscopy. In an embodiment, the electrical potential is a negative electrical potential relative to ground. In another embodiment, the oxidizing agent is $O_2$, $O_3$, $NO_2$, $H_2O_2$, or any combination thereof. In another embodiment, the chemical etchant is selected from the group consisting of HF, HCl, HBr and HI. In another embodiment, the holes or wires have an aspect ratio of at least about 100-to-1. In another embodiment, the holes or wires have an aspect ratio of at least about 1000-to-1. In another embodiment, the exposing generates primary and secondary holes in the substrate at a ratio of at least about 10:1.

Another aspect of the present disclosure provides a method for forming a thermoelectric element, comprising (a) applying an electrical potential to a semiconductor substrate, wherein the semiconductor substrate comprises a layer of a metal catalyst on a surface thereof; and (b) contacting the metallic material and the semiconductor substrate with an oxidizing agent and a chemical etchant to form holes in or wires from the semiconductor substrate at an etch rate of at least about 0.1 nanometers/second, wherein the holes or wires have an aspect ratio of at least about 20:1, and wherein surfaces of the substrate exposed by the holes or wires have a roughness between about 0.5 nanometers (nm) and 50 nm across the holes or wires as measured by transmission electron microscopy. In an embodiment, the method further comprises, subsequent to (c), chemically doping the semiconductor substrate with a p-type or n-type chemical dopant.

Another aspect of the present disclosure provides machine executable code that, upon execution by a computer processor, implements any of the methods above or elsewhere herein.

Another aspect of the present disclosure provides a computer system comprising a computer processor and memory coupled to the computer processor. The memory comprises machine executable code that, upon execution by the computer processor, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "FIG." and "FIGS." herein), of which:

DETAILED DESCRIPTION

Figure 1:
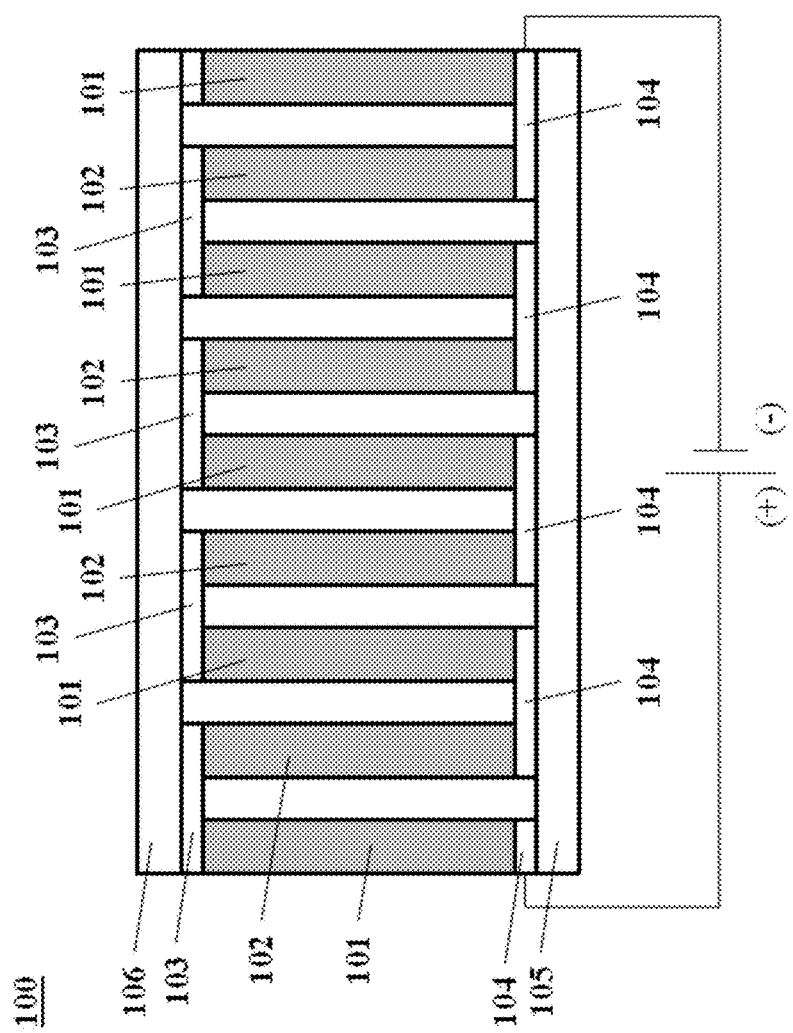
FIG. 1 shows a thermoelectric device having a plurality of elements.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

Disclosure of ranges herein includes disclosure of all values and further divided ranges within the entire range, including endpoints given for the ranges.

The term "nanostructure," as used herein, generally refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the dimension (e.g., width) is less than about 1000 nanometers ("nm"), or 500 nm, or 100 nm, or 50 nm, or smaller. Nanostructures can include holes formed in a substrate material. The holes can form a mesh having an array of holes. In other cases, nanostructure can include rod-like structures, such as wires, cylinders or box-like structure. The rod-like structures can have circular, elliptical, triangular, square, rectangular, pentagonal, hexagonal, heptagonal, octagonal or nonagonal, or other cross-sections.

The term "nanohole," as used herein, generally refers to a hole, filled or unfilled, having a width or diameter less than or equal to about 1000 nanometers ("nm"), or 500 nm, or 100 nm, or 50 nm, or smaller. A nanohole filled with a metallic, semiconductor, or insulating material can be referred to as a "nanoinclusion."

The term "nanowire," as used herein, generally refers to a wire or other elongate structure having a width or diameter that is less than or equal to about 1000 nm, or 500 nm, or 100 nm, or 50 nm, or smaller.

The term "n-type," as used herein, generally refers to a material that is chemically doped ("doped") with an n-type dopant. For instance, silicon can be doped n-type using phosphorous or arsenic.

The term "p-type," as used herein, generally refers to a material that is doped with an p-type dopant. For instance, silicon can be doped p-type using boron or aluminum.

The term "metallic," as used herein, generally refers to a substance exhibiting metallic properties. A metallic material can include one or more elemental metals.

The term "monodisperse," as used herein, generally refers to features having shapes, sizes (e.g., widths, cross-sections, volumes) or distributions (e.g., nearest neighbor spacing, center-to-center spacing) that are similar to one another. In some examples, monodisperse features (e.g., holes, wires) have shapes or sizes that deviate from one another by at most about 20%, 15%, 10%, 5%, 4%, 3%, 2%, 1%, 0.5%, or 0.1%. In some cases, monodisperse features are substantially monodisperse.

The term "etching material," as used herein, generally refers to a material that facilitates the etching of substrate (e.g., semiconductor substrate) adjacent to the etching material. In some examples, an etching material catalyzes the etching of a substrate upon exposure of the etching material to an oxidizing agent and a chemical etchant. The term "etching layer," as used herein, generally refers to a layer that comprises an etching material. Examples of etching materials include silver, platinum, chromium, molybdenum, tungsten, osmium, iridium, rhodium, ruthenium, palladium, copper, nickel and other metals (e.g., noble metals), or any combination thereof, or any non-noble metal that can catalyze the decomposition of a chemical oxidant, such as, for example, copper, nickel, or combinations thereof.

The term "etch block material," as used herein, generally refers to a material that blocks or otherwise impedes the etching of a substrate adjacent to the etch block material. An etch block material may provide a substrate etch rate that is reduced, or in some cases substantially reduced, in relation to a substrate etch rate associated with an etching material. The term "etch block layer," as used herein, generally refers to a layer that comprises an etch block material. An etch block material can have an etch rate that is lower than that of an etching material.

The term "reaction space," as used herein, generally refers to any environment suitable for the formation of a thermoelectric device or a component of the thermoelectric device. A reaction space can be suitable for the deposition of a material film or thin film adjacent to a substrate, or the measurement of the physical characteristics of the material film or thin film. A reaction space may include a chamber, which may be a chamber in a system having a plurality chambers. The system may include a plurality of fluidically separated (or isolated) chambers. The system may include multiple reactions spaces, with each reaction space being fluidically separated from another reaction space. A reaction space may be suitable for conducting measurements on a substrate or a thin film formed adjacent to the substrate.

The term "adjacent" or "adjacent to," as used herein, includes 'next to', 'adjoining', 'in contact with', and 'in proximity to'. In some instances, adjacent components are separated from one another by one or more intervening layers. The one or more intervening layers may have a thickness less than about 10 micrometers ("microns"), 1 micron, 500 nanometers ("nm"), 100 nm, 50 nm, 10 nm, 1 nm, 0.5 nm or less. For example, a first layer adjacent to a second layer can be in direct contact with the second layer. As another example, a first layer adjacent to a second layer can be separated from the second layer by at least a third layer.

Thermoelectric Elements, Devices and Systems

The present disclosure provides thermoelectric elements, devices and systems that can be employed for use in various applications, such as heating and/or cooling applications, or power generation. Thermoelectric devices of the present disclosure have various non-limiting advantages and benefits, such as substantially high aspect ratios, uniformity of holes or wires, and figure-of-merit, ZT, that can be suitable for optimum thermoelectric device performance. With respect to the figure-of-merit, Z can be an indicator of coefficient-of-performance (COP) and the efficiency of a thermoelectric device, and T can be an average temperature of the hot and the cold sides of the thermoelectric device. In some embodiments, the figure-of-merit (ZT) of a thermoelectric element or thermoelectric device is at least about 0.01, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In some case, the figure-of-merit is between about 0.01 and 3, or 0.1 and 2.5, or 0.5 and 2.0.

Thermoelectric devices of the present disclosure can have electrodes each comprising an array of nanostructures (e.g., holes or wires). The array of nanostructures can include a plurality of holes or elongate structures, such as wires (e.g., nanowires). Methods for forming the array of nanostructures are provided elsewhere herein.

FIG. 1 shows a thermoelectric device 100, in accordance with an embodiment of the invention. The thermoelectric device 100 includes n-type 101 and p-type 102 elements disposed between a first set of electrodes 103 and a second set of electrodes 104 of the thermoelectric device 100. The first set of electrodes 103 connects adjacent n-type 101 and p-type elements, as illustrated.

The electrodes 103 and 104 are in contact with a hot side material 105 and a cold side material 106 respectively. In some embodiments, the hot side material 105 and cold side material 106 are electrically insulating but thermally conductive. The application of an electrical potential to the electrodes 103 and 104 leads to the flow of current, which generates a temperature gradient ($\Delta T$) across the thermoelectric device 100. The temperature gradient ($\Delta T$) extends from a first temperature (average), T1, at the hot side material 105 to a second temperature (average), T2, at the cold side material 106, where T1>T2. The temperature gradient can be used for heating and cooling purposes.

The n-type 101 and p-type 102 elements of the thermoelectric device 100 can be formed of structures having dimensions from nanometers to micrometers, such as, e.g., nanostructures. In some situations, the nanostructures are holes or inclusions, which can be provided in an array of holes (i.e., mesh). In other situations, the nanostructures are rod-like structures, such as nanowires. In some cases, the rod-like structures are laterally separated from one another.

In some cases, the n-type 101 and/or p-type 102 elements are formed of an array of wires or holes oriented along the direction of the temperature gradient. That is, the wires extend from the first set of electrodes 103 to the second set of electrodes 104. In other cases, the n-type 101 and/or p-type 102 elements are formed of an array of holes oriented along a direction that is angled between about 0° and 90° in relation to the temperature gradient. In an example, the array of holes is orthogonal to the temperature gradient. The holes or wires, in some cases, have dimensions on the order of nanometers to micrometers. In some cases, holes can define a nanomesh.

Figure 2:
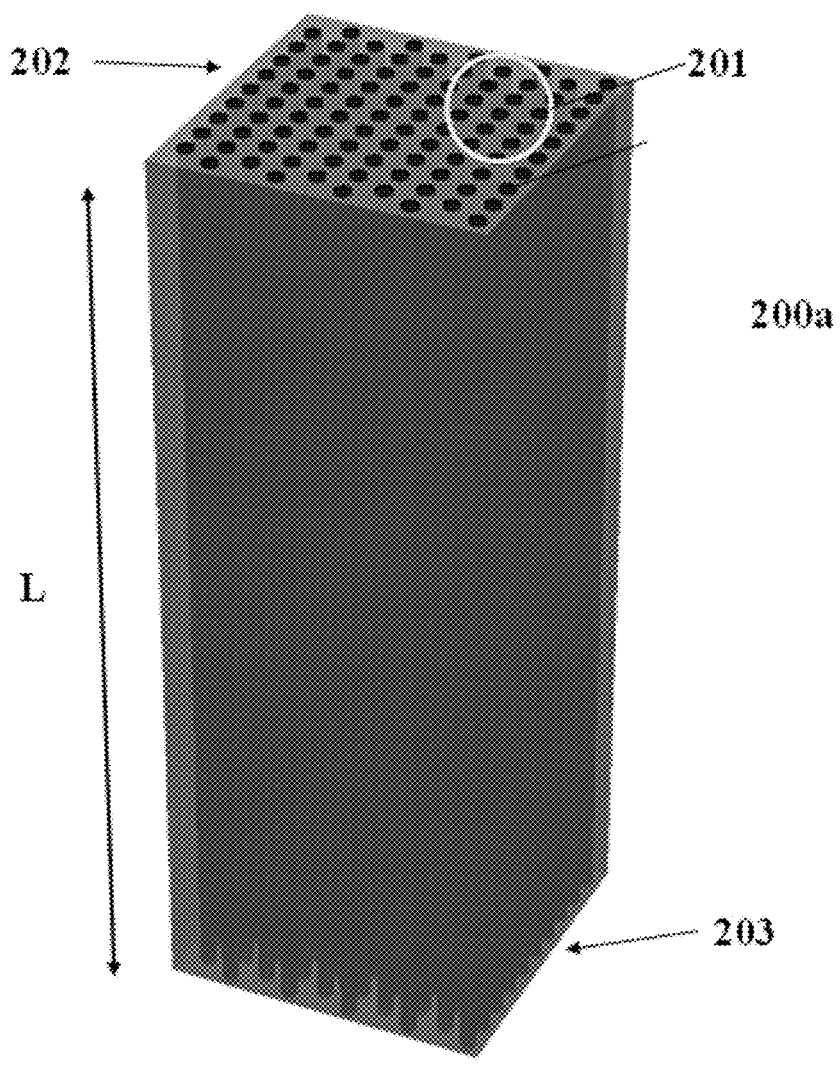
FIG. 2 is a schematic perspective view of a thermoelectric element, in accordance with an embodiment of the present disclosure.
Figure 3:
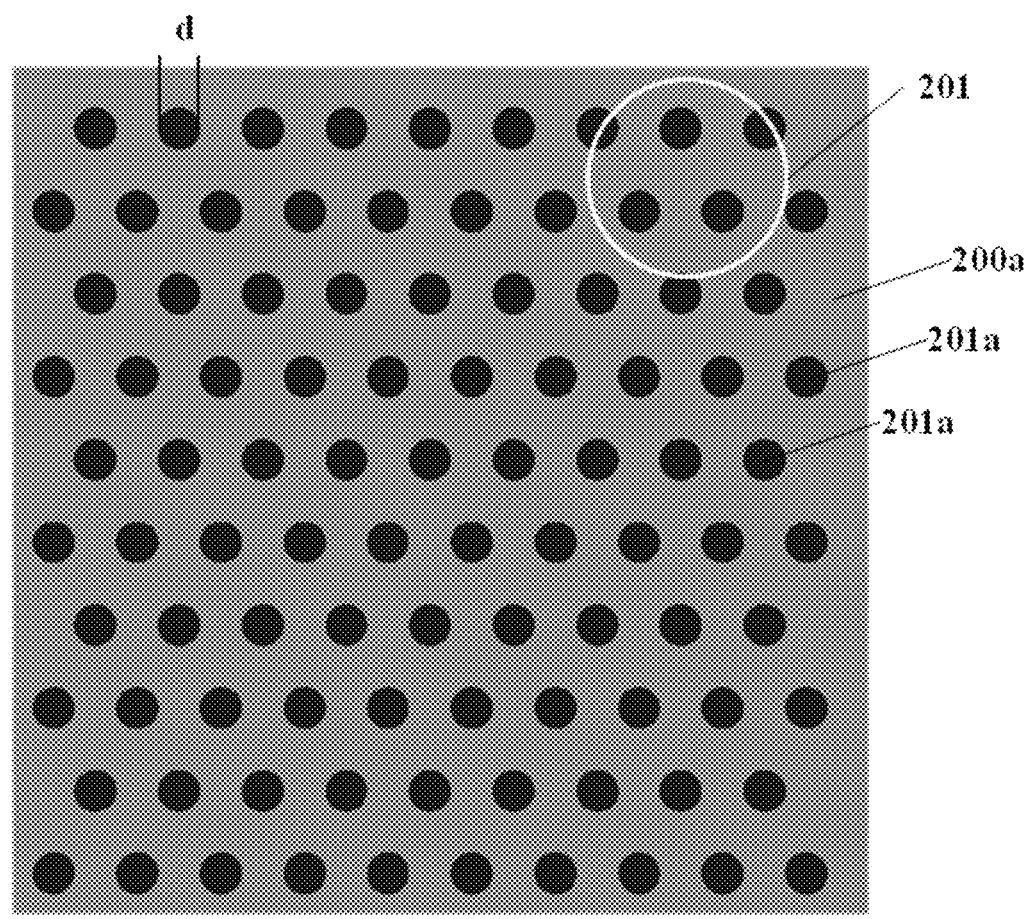
FIG. 3 is a schematic top view of the thermoelectric element of FIG. 2, in accordance with an embodiment of the present disclosure.
Figure 4:
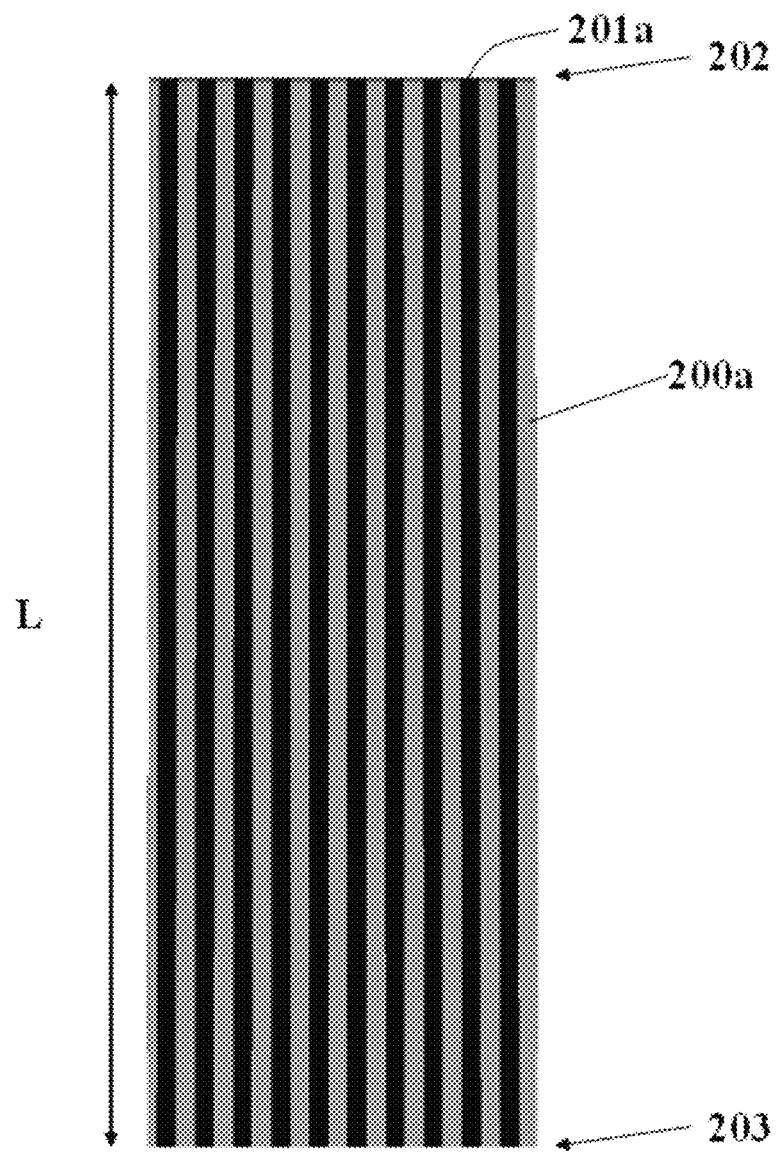
FIG. 4 is a schematic side view of the thermoelectric element of FIGS. 2 and 3, in accordance with an embodiment of the present disclosure.

FIG. 2 is a schematic perspective view of a thermoelectric element 200 having an array of holes 201 (select holes circled), in accordance with an embodiment of the present disclosure. The array of holes can be referred to as a "nanomesh" herein. FIGS. 3 and 4 are perspective top and side views of the thermoelectric element 200. The element 200 can be an n-type or p-type element, as described elsewhere herein. The array of holes 201 includes individual holes 201a that can have widths from several nanometers or less up to microns, millimeters or more. In some embodiments, the holes have widths (or diameters, if circular) ("d") between about 1 nm and 500 nm, or 5 nm and 100 nm, or 10 nm and 30 nm. The holes can have lengths ("L") from about several nanometers or less up to microns, millimeters or more. In some embodiments, the holes have lengths between about 0.5 microns and 1 centimeter, or 1 micron and 500 millimeters, or 10 microns and 1 millimeter.

The holes 201a are formed in a substrate 200a. In some cases, the substrate 200a is a solid state material, such as e.g., carbon, silicon, germanium, gallium arsenide, aluminum gallium arsenide, silicides, silicon germanium, bismuth telluride, lead telluride, oxides (e.g., $SiO_x$, where 'x' is a number greater than zero), gallium nitride and tellurium silver germanium antimony (TAGS) containing alloys. For example, the substrate 200a can be a Group IV material (e.g., silicon or germanium) or a Group III-V material (e.g., gallium arsenide). The substrate 200a may be formed of a semiconductor material comprising one or more semiconductors. The semiconductor material can be doped n-type or p-type for n-type or p-type elements, respectively.

In some cases, the holes 201a are filled with a gas, such as He, Ne, Ar, $N_2$, $H_2$, $CO_2$, $O_2$, or a combination thereof. In other cases, the holes 201a are under vacuum. Alternatively, the holes may be filled (e.g., partially filled or completely filled) with a semiconductor material, an insulating (or dielectric) material, or a gas (e.g., He, Ar, $H_2$, $N_2$, $CO_2$).

A first end 202 and second end 203 of the element 200 can be in contact with a substrate having a semiconductor-containing material, such as silicon or a silicide. The substrate can aid in providing an electrical contact to an electrode on each end 202 and 203. Alternatively, the substrate can be precluded, and the first end 202 and second end 203 can be in contact with a first electrode (not shown) and a second electrode (not shown), respectively.

In some embodiments, the holes 201a are substantially monodisperse. Monodisperse holes may have substantially the same size, shape and/or distribution (e.g., cross-sectional distribution). In other embodiments, the holes 201a are distributed in domains of holes of various sizes, such that the holes 201a are not necessarily monodisperse. For example, the holes 201a may be polydisperse. In some situations, the device 200 includes a first set of holes with a first diameter and a second set of holes with a second diameter. The first diameter is larger than the second diameter. In other cases, the device 200 includes two or more sets of holes with different diameters.

The holes 201a can have various packing arrangements. In some cases, the holes 201a, when viewed from the top (see FIG. 3), have a hexagonal close-packing arrangement.

In some embodiments, the holes 201a in the array of holes 201 have a center-to-center spacing between about 1 nm and 500 nm, or 5 nm and 100 nm, or 10 nm and 30 nm. In some cases, the center-to-center spacing is the same, which may be the case for monodisperse holes 201a. In other cases, the center-to-center spacing can be different for groups of holes with various diameters and/or arrangements.

The dimensions (lengths, widths) and packing arrangement of the holes 201, and the material and doping configuration (e.g., doping concentration) of the element 200 can be selected to effect a predetermined electrical conductivity and thermal conductivity of the element 200, and a thermoelectric device having the element 200. For instance, the diameters and packing configuration of the holes 201 can be selected to minimize the thermal conductivity, and the doping concentration can be selected to maximize the electrical conductivity of the element 200.

The array of holes 201 can have an aspect ratio (e.g., the length of the element 200 divided by width of an individual hole 201a) of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more.

In some embodiments, thermoelectric elements can include an array of wires. The array of wires can include individual wires that are, for example, rod-like structures.

Figure 5:
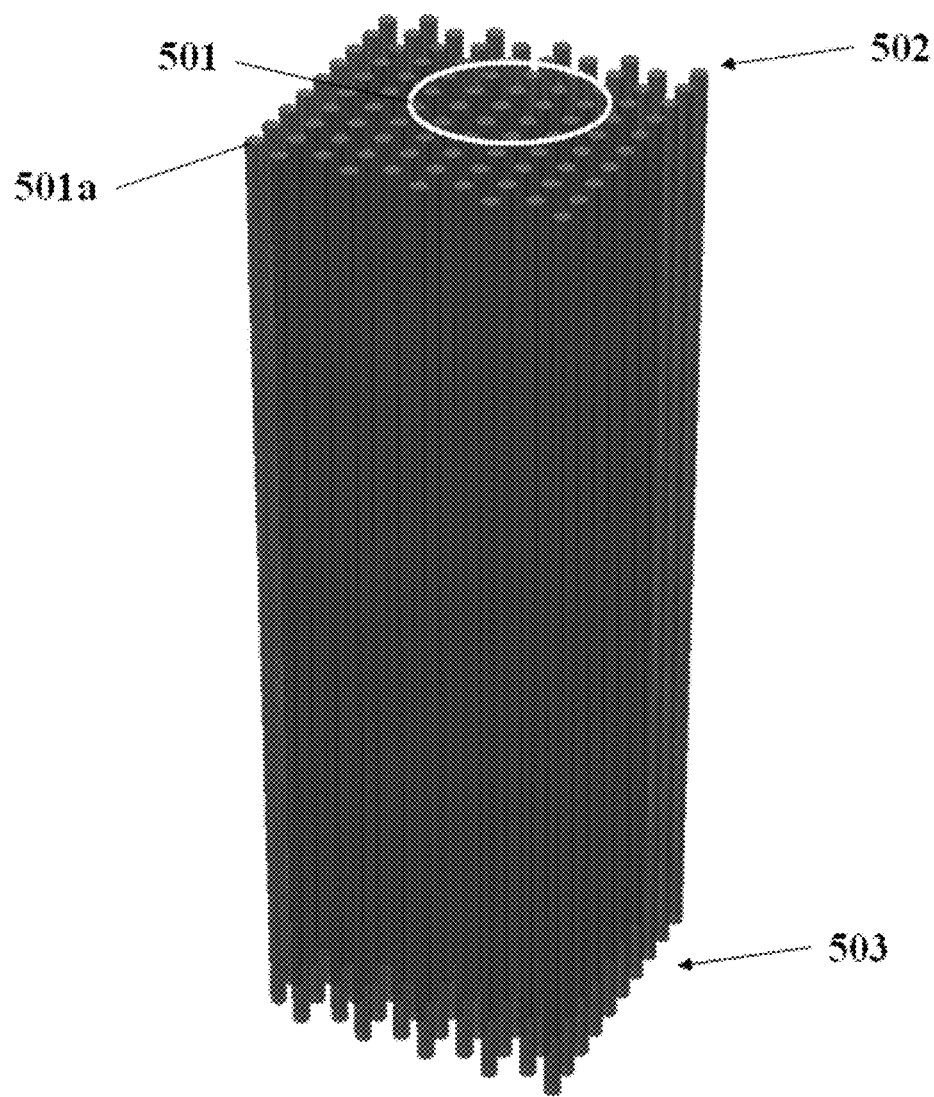
FIG. 5 is a schematic perspective top view of a thermoelectric element, in accordance with an embodiment of the present disclosure.
Figure 6:
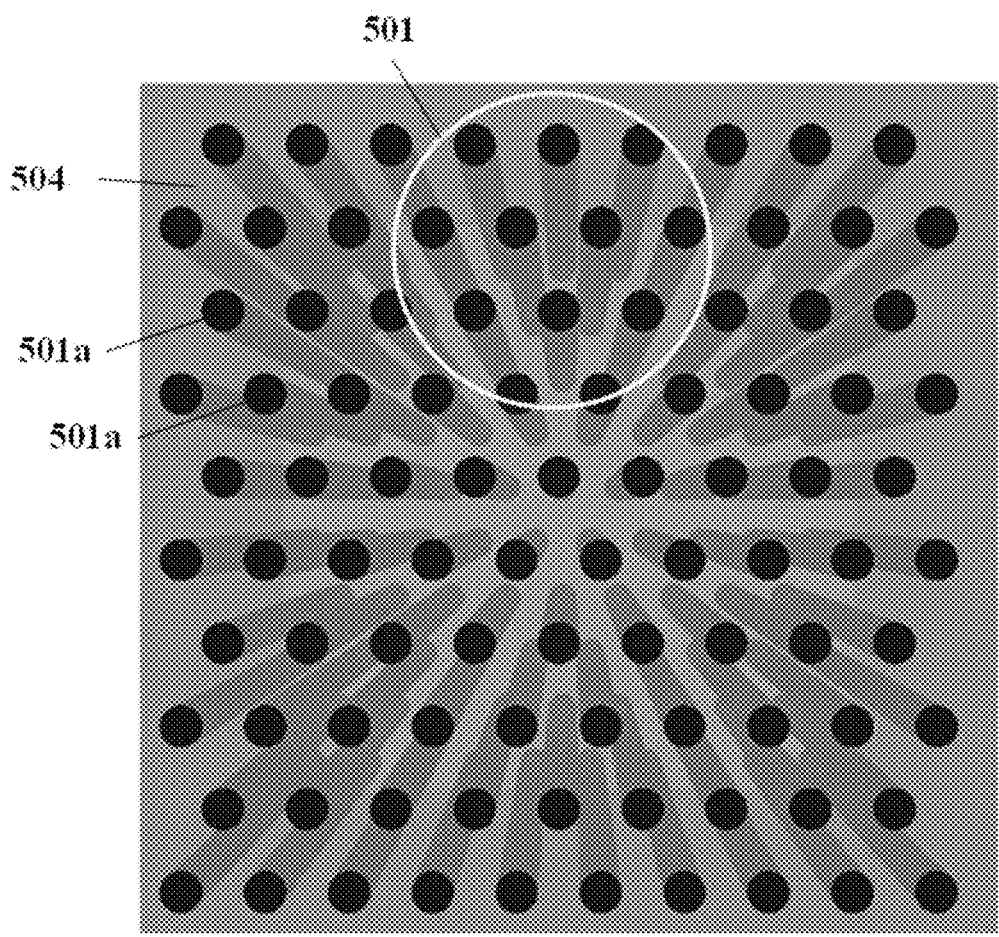
FIG. 6 is a schematic perspective top view of the thermoelectric element of FIG. 5, in accordance with an embodiment of the present disclosure.

FIG. 5 is a schematic perspective top view of a thermoelectric element 500, in accordance with an embodiment of the present disclosure. FIG. 6 is a schematic perspective top view of the thermoelectric element 500. The thermoelectric element 500 may be used with devices, systems and methods provided herein. The element 500 includes an array of wires 501 having individual wires 501a. In some embodiments, the wires have widths (or diameters, if circular) ("d") between about 1 nm and 500 nm, or 5 nm and 100 nm, or 10 nm and 30 nm. The wires can have lengths ("L") from about several nanometers or less up to microns, millimeters or more. In some embodiments, the wires have lengths between about 0.5 microns and 1 centimeter, or 1 micron and 500 millimeters, or 10 microns and 1 millimeter.

In some embodiments, the wires 501a are substantially monodisperse. Monodisperse wires may have substantially the same size, shape and/or distribution (e.g., cross-sectional distribution). In other embodiments, the wires 501a are distributed in domains of wires of various sizes, such that the wires 501a are not necessarily monodisperse. For example, the wires 501a may be polydisperse.

In some embodiments, the wires 501a in the array of wires 501 have a center-to-center spacing between about 1 nm and 500 nm, or 5 nm and 100 nm, or 10 nm and 30 nm. In some cases, the center-to-center spacing is the same, which may be the case for monodisperse wires 501. In other cases, the center-to-center spacing can be different for groups of wires with various diameters and/or arrangements.

In some embodiments, the wires 501a are formed of a semiconductor material, such as, e.g., silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The wires 501a can be doped with an n-type dopant or a p-type dopant.

In some embodiments, the wires 501a are attached to semiconductor substrates at a first end 502 and second end 503 of the element 500. The semiconductor substrates can have the n-type or p-type doping configuration of the individual wires 501a. In other embodiments, the wires 501a at the first end 502 and second end 503 are not attached to semiconductor substrates, but can be attached to electrodes. For instance, a first electrode (not shown) can be in electrical contact with the first end 502 and a second electrode can be electrical contact with the second end 503.

With reference to FIG. 6, space 504 between the wires 501a may be filled with a vacuum or various materials. In some embodiments, the wires are laterally separated from one another by an electrically insulating material, such as a silicon dioxide, germanium dioxide, gallium arsenic oxide, spin on glass, and other insulators deposited using, for example, vapor phase deposition, such as chemical vapor deposition or atomic layer deposition. In other embodiments, the wires are laterally separated from one another by vacuum or a gas, such as He, Ne, Ar, $N_2$, $H_2$, $CO_2$, $O_2$, or a combination thereof.

The array of wires 501 can have an aspect ratio—length of the element 500 divided by width of an individual wire 501a—of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more. In some cases, the length of the element 500 and the length of an individual wire 501a are substantially the same.

Thermoelectric elements provided herein can be incorporated in thermoelectric devices for use in cooling and/or heating and, in some cases, power generation. In some examples, the device 100 may be used as a power generation device. In an example, the device 100 is used for power generation by providing a temperature gradient across the electrodes and the thermoelectric elements of the device 100.

Figure 7:
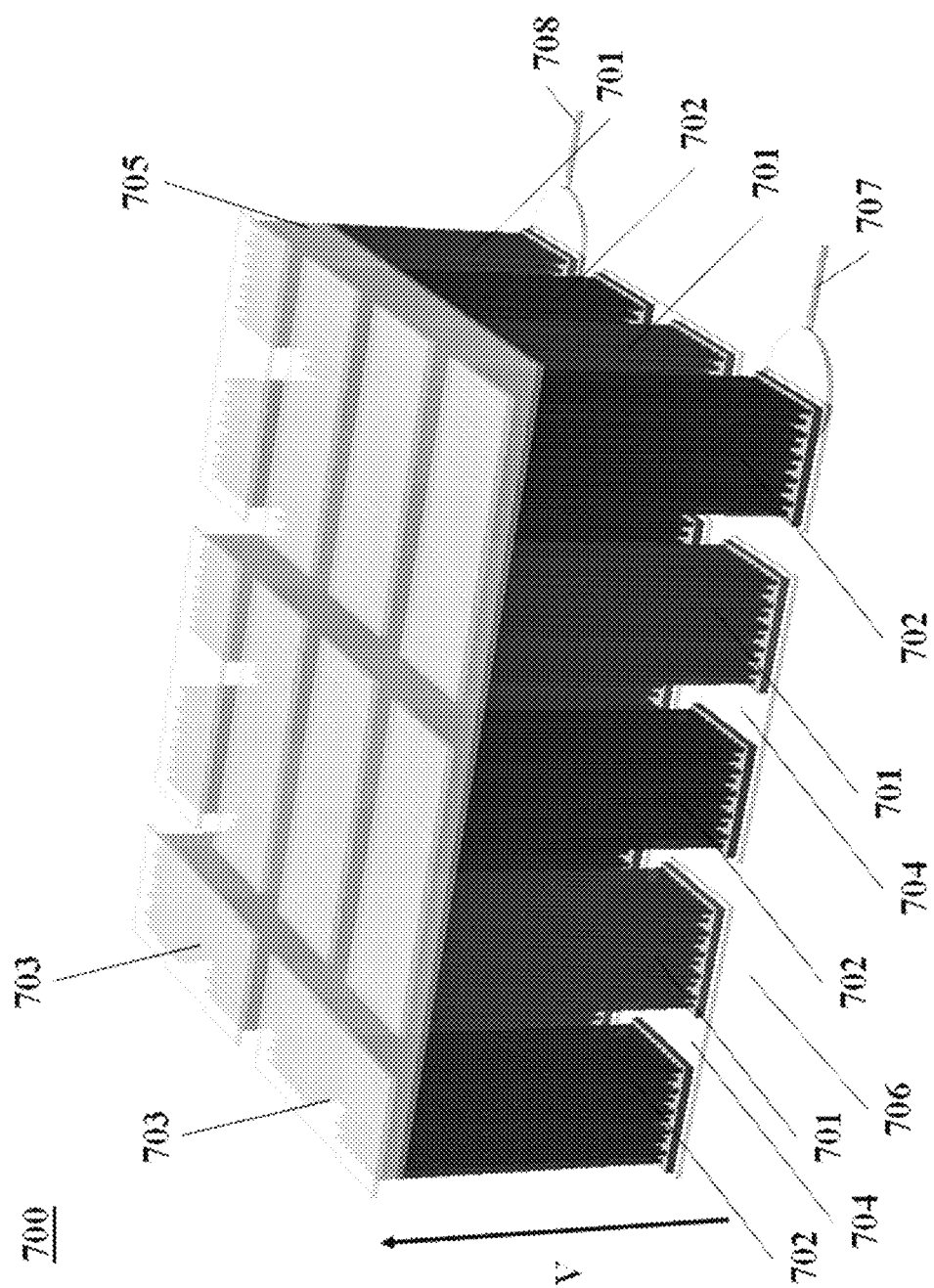
FIG. 7 is a schematic perspective view of a thermoelectric device comprising elements having an array of wires, in accordance with an embodiment of the present disclosure.

FIG. 7 shows a thermoelectric device 700 having n-type elements 701 and p-type elements 702, in accordance with an embodiment of the present disclosure. The n-type elements 701 and p-type elements 702 each include an array of wires, such as nanowires. An array of wires can include a plurality of wires. The n-type elements 701 include n-type (or n-doped) wires and the p-type elements 702 include p-type wires. The wires can be nanowires or other rod-like structures.

Adjacent n-type elements 701 and p-type elements 702 are electrically connected to one another at their ends using electrodes 703 and 704. The device 700 includes a first thermally conductive, electrically insulating layer 705 and a second thermally conductive, electrically insulating layer 706 at opposite ends of the elements 701 and 702.

The device 700 includes terminals 707 and 708 that are in electrical communication with the electrodes 703 and 704. The application of an electrical potential across the terminals 707 and 708 generates a flow of electrons and holes in the n-type and p-type elements 701 and 702, respectively, which generates a temperature gradient across the elements 701 and 702. The first thermally conductive, electrically insulating layer 705 is a cold side of the device 700; the second thermally conductive, electrically insulating layer 706 is a hot side of the device 700. The cold side is cooler (i.e., has a lower operating temperature) than the hot side.

Figure 8:
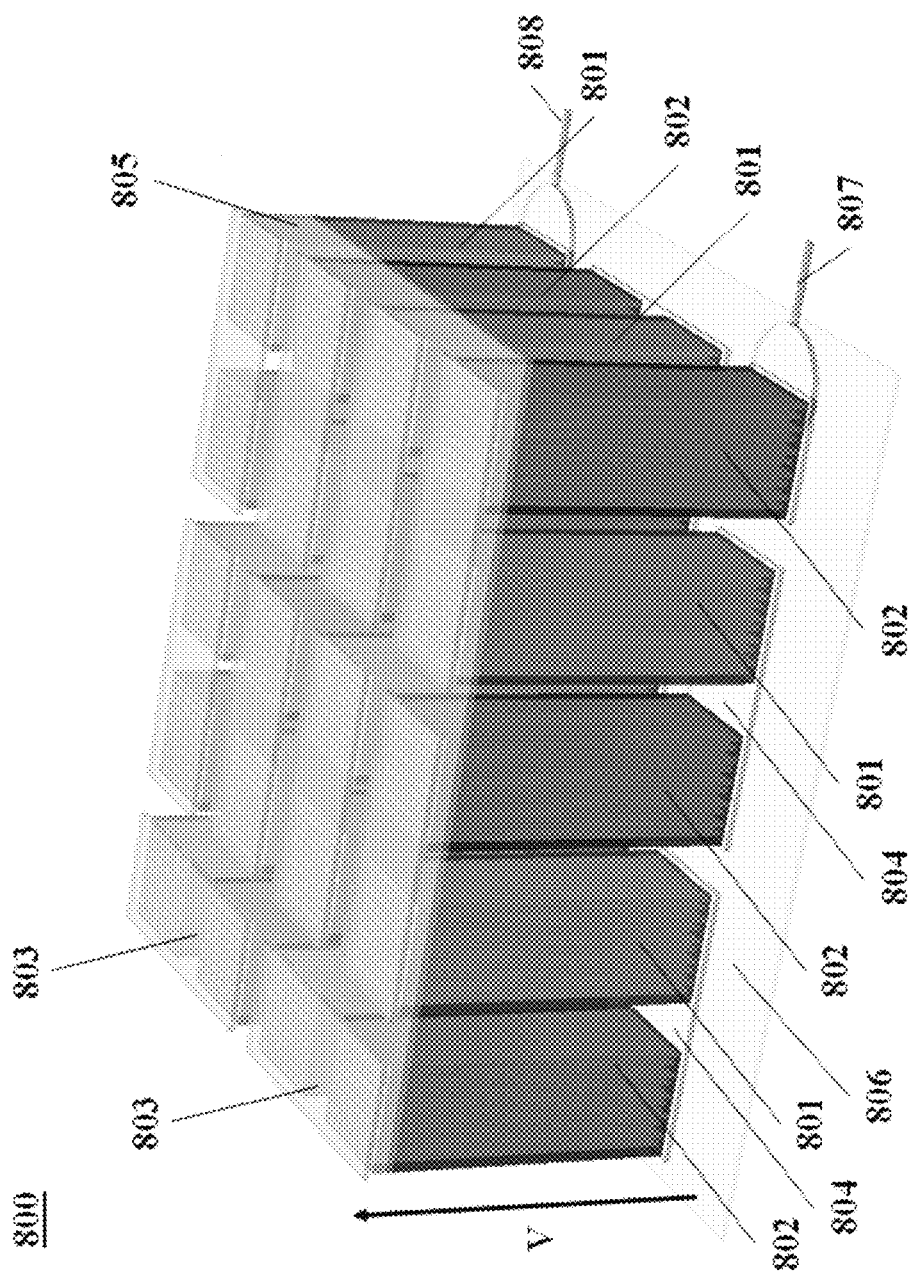
FIG. 8 is a schematic perspective view of a thermoelectric device comprising elements having an array of holes, in accordance with an embodiment of the present disclosure.

FIG. 8 shows a thermoelectric device 800 having n-type elements 801 and p-type elements 802, in accordance with an embodiment of the present disclosure. The n-type elements 801 and p-type elements 802 are formed in n-type and p-type semiconductor substrates, respectively. Each substrate can include an array of holes, such as nanoholes. The array of holes each include a plurality of holes. An individual hole can span the length of an n-type or p-type element. The holes can be monodisperse, in which case hole dimensions and center-to-center spacing may be substantially constant. In some cases, the array of holes includes holes with center-to-center spacing and hole dimensions (e.g., widths or diameters) that may be different. In such a case, the holes may not be monodisperse.

Select n-type elements 801 and p-type elements 802 are electrically connected to one another at their ends by electrodes 803 and 804. The device 800 includes a first thermally conductive, electrically insulating layer ("first layer") 805 and a second thermally conductive, electrically insulating layer ("second layer") 806 at opposite ends of the elements 801 and 802.

The device 800 includes terminals 807 and 808 that are in electrical communication with the electrodes 803 and 804. The application of an electrical potential across the terminals 807 and 808 generates the flow of electrons and holes in the n-type and p-type elements 801 and 802, respectively, which generates a temperature gradient across the elements 801 and 802. The first thermally conductive, electrically insulating layer 805 is a cold side of the device 800; the second thermally conductive, electrically insulating layer 806 is a hot side of the device 800. The cold side is cooler (i.e., has a lower operating temperature) than the hot side.

The thermoelectric device 800 has a temperature gradient from the second thermally conductive, electrically insulating layer 806 to the first thermally conductive, electrically insulating layer 805. In some cases, the holes are disposed parallel to a vector oriented from the first layer 805 to the second layer 806. In other cases, the holes are disposed at an angle greater than 0° in relation to the vector. For instance, the holes can be disposed at an angle of at least about 1°, 10°, 20°, 30°, 40°, 50°, 60°, 70°, 80°, or 90° in relation to the vector.

Figure 9:
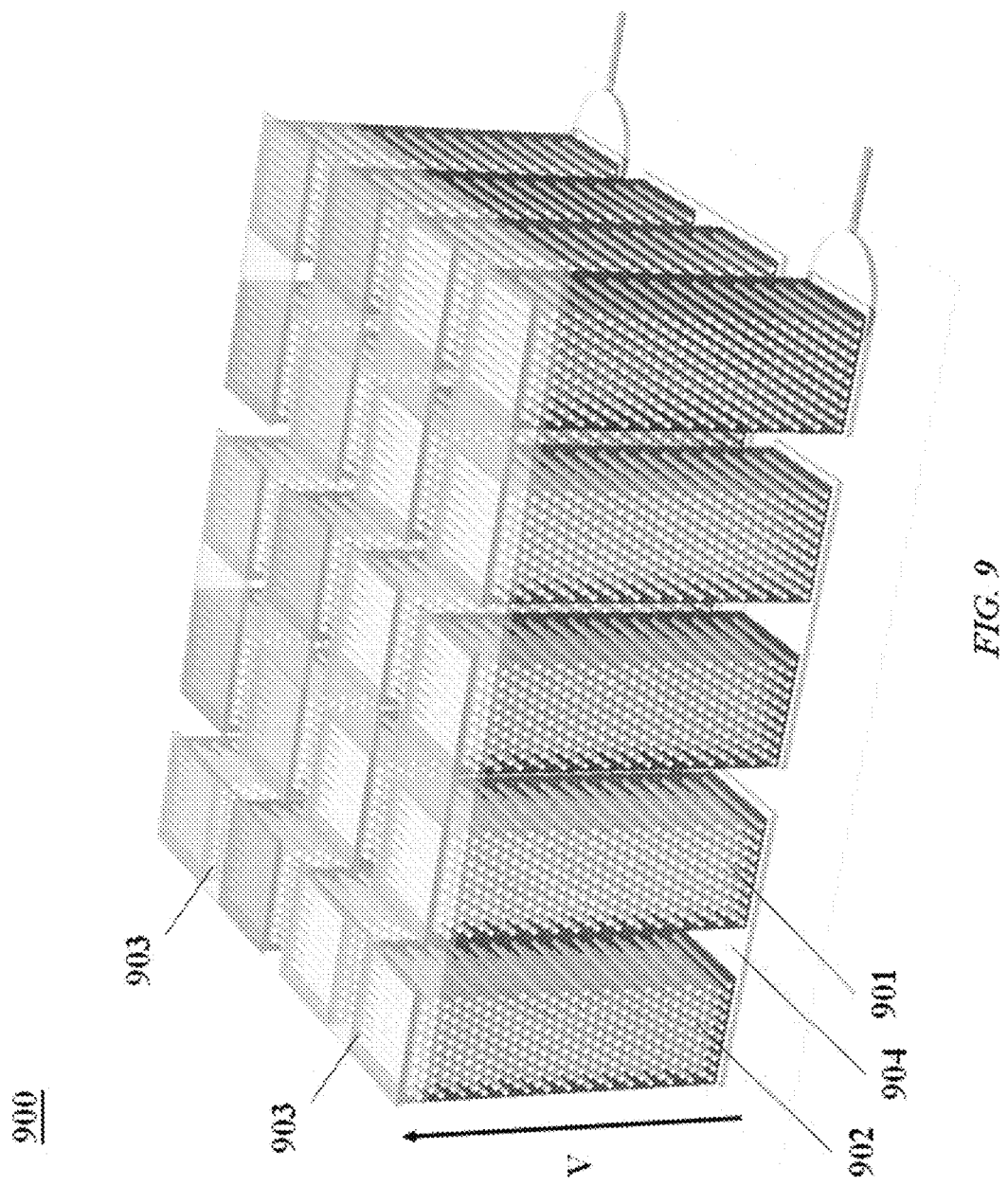
FIG. 9 is a schematic perspective view of a thermoelectric device comprising elements having an array of holes that are oriented perpendicularly with respect to the vector V, in accordance with an embodiment of the present disclosure.

FIG. 9 shows a thermoelectric device 900 having n-type elements 901 and p-type elements 902, with the elements having holes formed in substrates of the n-type and p-type elements. The holes are oriented perpendicular to a vector ("V") orthogonal to the electrodes 903 and 904 of the device 900.

Wires or holes of thermoelectric elements provided herein may be formed in a substrate and oriented substantially anti-parallel to a support structure, such as an electrode. In some examples, the wires or holes are oriented at an angle greater than 0°, or 10°, or 20°, or 30°, or 40°, or 50°, or 60°, or 70°, or 80°, or 85° in relation to the support structure. In an example, the wires or holes are oriented at an angle of about 90° in relation to the support structure. The electrode may be an electrode of a thermoelectric device. In some cases, wires or holes may be oriented substantially parallel to the electrode.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Methods for Forming Thermoelectric Elements

The present disclosure provides methods for forming thermoelectric elements, which can be incorporated in thermoelectric devices and systems. Thermoelectric elements can include holes or wires, or a pattern of holes or wires. In some embodiments, holes can be formed on, or wires can be formed from, a substrate. A method for forming a thermoelectric element can comprise defining, with the aid of a metallic material, a pattern to be transferred to the substrate, and catalytically etching the substrate to define the pattern in the substrate.

In some embodiments, a method for forming a thermoelectric device having a plurality of holes comprises forming a pattern of holes or wires in a mask, and transferring the pattern of holes or wires to a substrate to form holes or wires in the substrate. Methods for forming masks having a pattern of holes or wires and transferring the pattern to a substrate are provided in PCT/US13/21900 to Boukai et al. ("SYSTEMS AND METHODS FOR FORMING THERMOELECTRIC DEVICES"), which is entirely incorporated herein by reference for all purposes.

In an example, a mask is provided adjacent to a substrate. The mask includes three-dimensional structures phase-separated in a polymer matrix. The substrate can be a semiconductor substrate, such as a silicon substrate. The mask is formed by providing a polymeric mixture having a first polymeric material and a second polymeric material adjacent to the substrate, and spin coating the polymeric mixture over the substrate. Next, the polymeric mixture is thermally annealed, upon which annealing the polymeric mixture phase separates into domains of three-dimensional structures (e.g., cylindrical structures) that define a pattern. The three-dimensional structures can include block copolymers (see below). Alternatively, the polymeric mixture can be phase separated by evaporating a solvent. The three-dimensional structures are disposed in a polymeric matrix having the first polymeric material. Next, an array of holes is formed in the substrate by etching the three-dimensional structures to reveal the substrate, and catalytically transferring the array to the substrate to provide an array of holes (or inclusions) in the substrate.

Figure 14:
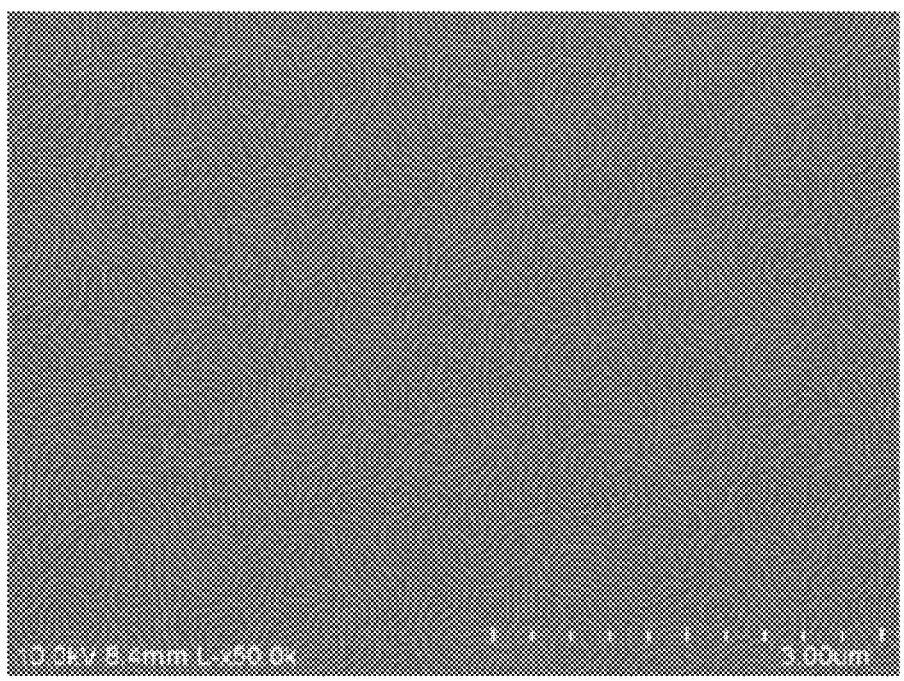
FIG. 14 shows a template having three-dimensional structures in a fingerprint pattern, in accordance with an embodiment of the present disclosure.

The three-dimensional structures can be generally cylindrical in shape. As an alternative, the three-dimensional structure can have other shapes, such as shapes with triangular, square, rectangular, pentagonal, hexagonal, heptagonal, octagonal, or nonagonal, or partial shapes or combinations thereof. In some cases, the three-dimensional structures can have a fingerprint pattern (see FIG. 14), which can comprise elongate three-dimensional structures in various patterns, such as a maze-like pattern.

A template can be formed of a copolymer (e.g., block copolymer). In an example, a template is formed by providing a block copolymer and forming an array of cylinders in the block copolymer to define the template. The block copolymer can be a cylinder forming block copolymer, which can provide cylindrical three-dimensional structures, or a lamellar-forming block copolymer, which can provide three-dimensional structures in a fingerprint pattern (see FIG. 14).

A template (or mask) can be formed of a first polymeric material and the three-dimensional structures defining a pattern are formed of a second polymeric material. The second polymeric material is embedded in a polymeric matrix comprising the first and second polymeric materials. In some embodiments, the polymeric matrix comprises a block copolymer having the first polymeric material and the second polymeric material. The polymeric matrix can include a multi-block copolymer, such as a di-block copolymer, tri-block copolymer or tetra-block copolymer. In other embodiments, the polymeric matrix comprises homo polymers of the first and second polymeric materials.

The first polymeric material can be formed of a material having a molecular weight of at least about 1 kilodalton (kDa), or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or 200 kDa, or more. In some situations, the first polymeric material has a molecular weight between about 10 kDa and 80 kDa, or 20 kDa and 60 kDa, or 30 kDa and 50 kDa. In some examples, the first polymeric material is polystyrene.

The second polymeric material can be formed of a material having a molecular weight of at least about 1 kDa, or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or more. In some situations, the second polymeric material has a molecular weight between about 5 kDa and 40 kDa, or 10 kDa and 30 kDa, or 15 kDa and 25 kDa. In some examples, the second polymeric material is a block copolymer. In some cases, the second polymeric material can be selected from poly(methyl methacrylate) (PMMA), poly(dimethylsiloxane) (PDMS), poly(ethylene oxide) (PEO), poly(4-vinylpyridine) (P4VP), poly(2-vinylpyridine) (P2VP), or mixtures thereof.

The second polymeric material can be removed with the aid of an etching chemistry that can be selected based on the material comprising the second polymeric material and, in some cases, the first polymeric material. For example, a second polymeric material formed of PDMS can be etched using hydrogen fluoride. As another example, a second polymeric material formed of PEO can be etched using hydrogen iodide. As another example, PMMA can be etched using acetic acid. Etching chemistries for various polymeric materials can be found at, for example, Silverstein, M. S., Cameron, N. R., & Hillmyer, M. A. (2011), *Porous Polymers*, New Jersey: John Wiley & Sons, Inc., which is entirely incorporated herein by reference.

The template can be used to form a pattern of holes or rod-like structures. An array of holes can be formed in the substrate by providing a metallic material in the holes of the template to define an array of particles (e.g., nanoparticles) adjacent to the substrate. With the aid of the metallic material, the substrate can be etched to form a thermoelectric element having an array of holes. Alternatively, an array of rod-like structure can be formed from the substrate by etching, with the aid of a metallic material, the substrate relative to metallic particles adjacent to the substrate to form a thermoelectric element having an array of rods (or wires).

The disclosure provides various methods for forming inclusions (e.g., holes, wires) in or from a substrate, which can subsequently be used as a thermoelectric element (e.g., element 101 of FIG. 1) of a thermoelectric device. The disclosure also provides various methods for forming thermoelectric elements.

Wafer Bonding

Thermoelectric elements in peltier and power generating modules may require mechanical properties to keep the elements from fracturing under thermal load and the weight of the hot and cold side heat exchangers. This may require thermoelectric elements that are about 1 $mm^2$ in thickness and about 1 mm in length, for example. Semiconductor wafers currently available, however, may have thicknesses from about 10 micrometers ("microns") to 500 microns and, individually, may not have a mechanical robustness and properties that are suitable for forming thermoelectric elements. A thermoelectric element formed from a semiconductor wafer having a thickness from about 10 microns to 500 microns may exhibit various issues during use, such as, for example, when the temperature gradient or current flow is parallel to the thickness.

An aspect of the disclosure provides a method for forming a thermoelectric element by bonding individual thermoelectric elements together. The individual thermoelectric elements may be as described above or elsewhere herein. For instance, the individual thermoelectric elements may have holes (e.g., nanoholes) or wires (e.g., nanowires).

Bonding can be accomplished with the aid of wafer bonding approaches, such as direct bonding and indirect bonding. Bonding of semiconductor wafers can allow for stacking of individual (e g, thinner) thermoelectric elements to form a stack having various thicknesses, such as thicknesses greater than or equal to about 0.01 micrometers ("micron"), 0.1 microns, 0.5 microns, 1 micron, 10 microns, 100 microns, 1 millimeter. In some cases, a plurality of semiconductor wafers can be bonded or otherwise mechanically coupled to one another to form a thermoelectric element of a desired or otherwise predetermined thickness.

Figure 10:
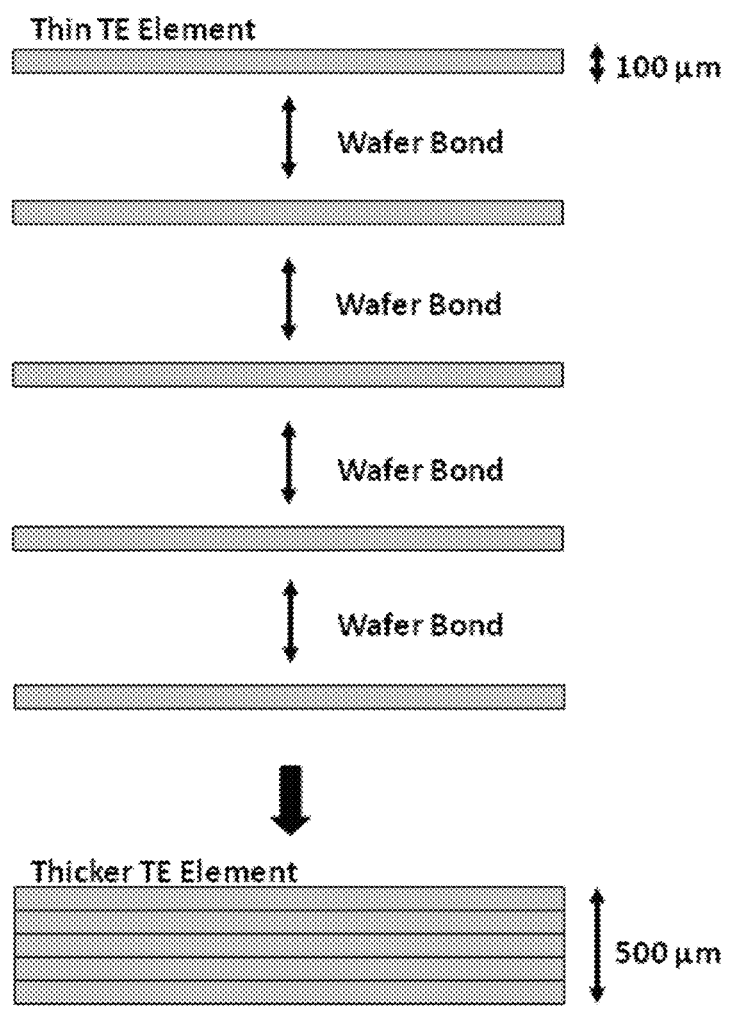
FIG. 10 schematically illustrates a semiconductor wafer bonding process, in accordance with an embodiment of the present disclosure.

FIG. 10 shows a method for forming a thermoelectric element (TE) from a plurality of individual thermoelectric elements having thicknesses of about 100 microns. In the illustrated example, five individual thermoelectric elements are bonded together to form a thermoelectric element stack having a thickness of about 500 microns.

Adjacent thermoelectric elements in the stack can be bonded together via direct bonding, indirect bonding, or anodic bonding. A direct bonding technique can include pre-treating a semiconductor wafer (e.g., silicon wafer) by cleaning the wafer in an oxidizing plasma (e.g., $O_2$ plasma, $NO_2$ plasma, $H_2O_2$ plasma or $O_3$ plasma) or a wet chemical, such as piranha (e.g., sulfuric acid and hydrogen peroxide), to form —OH (e.g., silanol) groups on the surface of the semiconductor wafer. Next, adjacent semiconductor wafers are pressed together and subsequently heated to a temperature between about 150° C. and 1000° C. for at least about 10 minutes, 30 minutes, 1 hour, 2 hours, 3 hours, 4 hours, 5 hours, 6 hours, 12 hours, or more. During heating, the OH can polymerize into Si—O—Si bonds between the two wafers, thereby bonding adjacent wafers together. As an alternative or in conjunction with heating, pressure can be applied to press the wafers together. Adjacent wafers can be pressed together at a pressure that is greater than or equal to about 1 atm, 2 atm, 3 atm, 4 atm, 5 atm, 10 atm, 100 atm, 1000 atm, 10,000 atm, in some cases while the wafers are heated at a temperature between about 150° C. and 1000° C.

In indirect bonding, an intermediate later between adjacent wafers can be used to bond the wafers together. The intermediate layer can include a semiconductor oxide. In an example, a thin layer of spin-on glass is drop-cast onto one semiconductor (e.g., silicon) wafer and pressed onto an adjacent semiconductor wafer. Pressure and heat can then be applied to the two wafers for at least about 10 minutes, 30 minutes, 1 hour, 2 hours, 3 hours, 4 hours, 5 hours, 6 hours, 12 hours, or more. Adjacent wafers can be pressed together at a pressure that is greater than or equal to about 1 atm, 2 atm, 3 atm, 4 atm, 5 atm, 10 atm, 100 atm, 1000 atm, 10,000 atm, while the wafers are heated at a temperature between about 100° C. and 1000° C. Adjacent wafers can be pressed together in an inert (e.g., $N_2$, Ar, or He) environment or under vacuum. This may result in a strong bond between the wafers.

Spin on glass (SOG) is a mixture of $SiO_2$ (or other semiconductor oxide) and dopants (e.g., boron or phosphorous) that is suspended in a solvent solution. The SOG can be applied to a clean wafer by spin-coating, in a manner similar to the application of a photoresist. The SOG can be a dopant source for the wafer. When an SOG is applied to the wafer, the dopant from the SOG can deposit on the surface of the wafer. Subsequent heat can drive the dopant into the wafer.

In anodic bonding, an electrostatic voltage is used to bond adjacent wafers together. In an example, two semiconductor (e.g., silicon) wafers are cleaned (e.g., with the aid of piranha) and an electrostatic voltage is supplied between the two wafers at an elevated temperature to bond the wafers together. The elevated temperature can be between about 100° C. and 1000° C. The electrostatic voltage can be applied using electrodes disposed on opposite surfaces of the wafers, such as a top surface of a first wafer and a bottom surface of a second wafer. The electrostatic voltage can be in the range of about 1 V and 1000 V, or 10 V and 500 V, or 20 V and 200 V.

Wafer bonding can include a combination of direct bonding, indirect bonding and anodic bonding. For example, wafers may be bonded using an intermediate layer while applying electrostatic voltage across the wafers when they are brought in contact with, and pressed against, the intermediate layer.

The individual wafers of FIG. 10 may include nanostructures, such as holes or wires. The nanostructures can be formed in the wafers before bonding the wafers together. As an alternative, the nanostructures may be formed in the stack of wafers during wafer bonding or after the wafers have been bonded together.

Bonding methods provides herein can permit the formation of thermoelectric elements from thinner thermoelectric elements. In some examples, a thermoelectric element can include a stack of individual thermoelectric elements having at least 2, 3, 4, 5, 6, 7, 8, 9, 10, 20, 30, 40, 50, 60, 70, 80, 90, 100, 1000, or 10,000, with adjacent thermoelectric elements bonded together as described herein.

Cathodic Protection

Another aspect of the disclosure provides methods for the cathodic protection of semiconductors undergoing metal assisted etching to prevent porosity. Cathodic protection can permit the formation of thermoelectric elements with a desired or otherwise predetermined porosity.

Figure 11A:
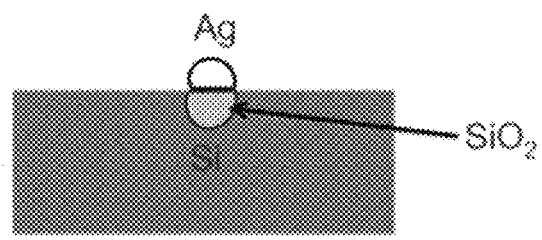
FIG. 11A-11C schematically illustrate a process for catalytically forming an array of holes, in accordance with an embodiment of the present disclosure.
Figure 11B:
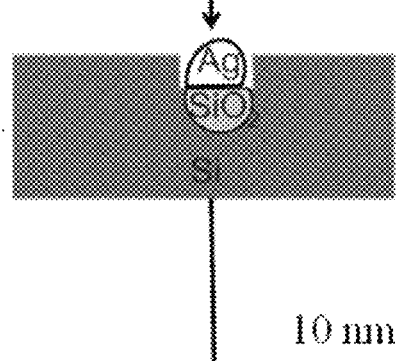
Figure 11C:
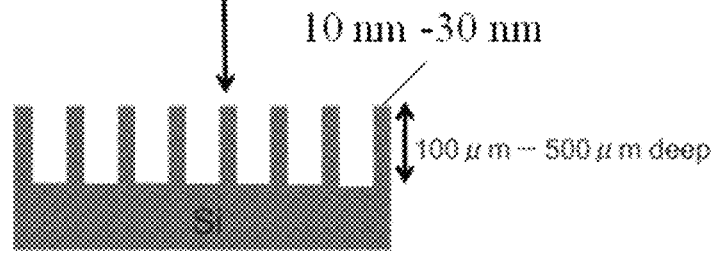

A semiconductor wafer may be used to form a pattern of nanostructures (e.g., holes or wires) by catalytically etching the semiconductor substrate. In some examples, the semiconductor wafer is formed of silicon. FIGS. 11A-11C schematically illustrate a process for catalytically etching a substrate. The illustrated process can be applied to various semiconductor materials, such as, for example, silicon. In FIG. 11A, with a silver catalyst deposited on a silicon substrate, the silicon substrate and the catalyst are exposed to an oxidizing agent, such as hydrogen peroxide ($H_2O_2$), to form silicon dioxide, which is then contact with a chemical etchant, such as hydrofluoric acid (HF), to remove the silicon dioxide (FIG. 11B). Further exposure of the silicon substrate and the catalyst to the oxidizing agent and the chemical etchant forms an array of holes in the silicon substrate, as shown in FIG. 11C. In some situations, the silicon substrate and the catalyst are simultaneously contacted with the oxidizing agent and the chemical etchant, while in other situations the silicon substrate and the catalyst are alternately and sequentially contacted with the oxidizing agent and the chemical etchant.

A semiconductor substrate can be catalytically etched by applying an electrical potential to the substrate, such as using electrodes adjacent to opposing surfaces of the substrate. The potential can be, for example, at least about −0.01 V, −0.02 V, −0.03 V, −0.04 V, −0.05 V, −0.06 V, −0.07 V, −0.08 V, −0.09 V, −0.1 V, −0.2 V, −0.3 V, −0.4 V, −0.5 V, −0.6 V, −0.7 V, −0.8 V, −0.9 V, −1.0 V, −2.0 V, −3.0 V, −4.0 V, −5.0 V, −10 V, −20 V, −30 V, −40 V, or −50 V relative to ground. The potential can be direct current (DC) or alternating current (AC), or a combination of DC and AC potentials. The electrical potential can direct an electric field across the substrate. As an alternative, no electrical potential is applied to the substrate during catalytic etching.

Various metals can be used to form nanostructures in a substrate. Examples of metals that can be used to form nanostructures include gold, silver, platinum, chromium, molybdenum, tungsten, osmium, iridium, rhodium, ruthenium, palladium, copper, nickel and other metals (e.g., noble metals), or any combination thereof, or any non-noble metal that can catalyze the decomposition of a chemical oxidant, such as, for example, copper, nickel, or combinations thereof.

Holes or wires can be formed in a semiconductor substrate using, for example, etching particles of gold, silver, platinum, chromium, molybdenum, tungsten, palladium, other noble metals, or combinations thereof. As an alternative, the particles may include magnetic elements (e.g., Fe, Co, Ni, Gd, Dy, etc) with noble metals. Alternatively, magnetic compounds may be used in combination with noble metals (e.g., AlNiCo, SmCo, NdFeB, etc). In some cases, a trilayer stack of noble metals sandwiching the magnetic element/compound can be used. If an etching particle comprises a magnetic material, catalyzed etching can be performed in the presence of a magnetic field in order to direct the particles.

The process of FIGS. 11A-11C may be used to form a pattern of holes or wires in a substrate, such as a semiconductor, insulating or metallic substrate. In the case of a semiconductor substrate, the substrate may be intrinsic or doped with an n-type (e.g., N, P) or p-type (e.g., B, Al) chemical dopant.

Figure 12:
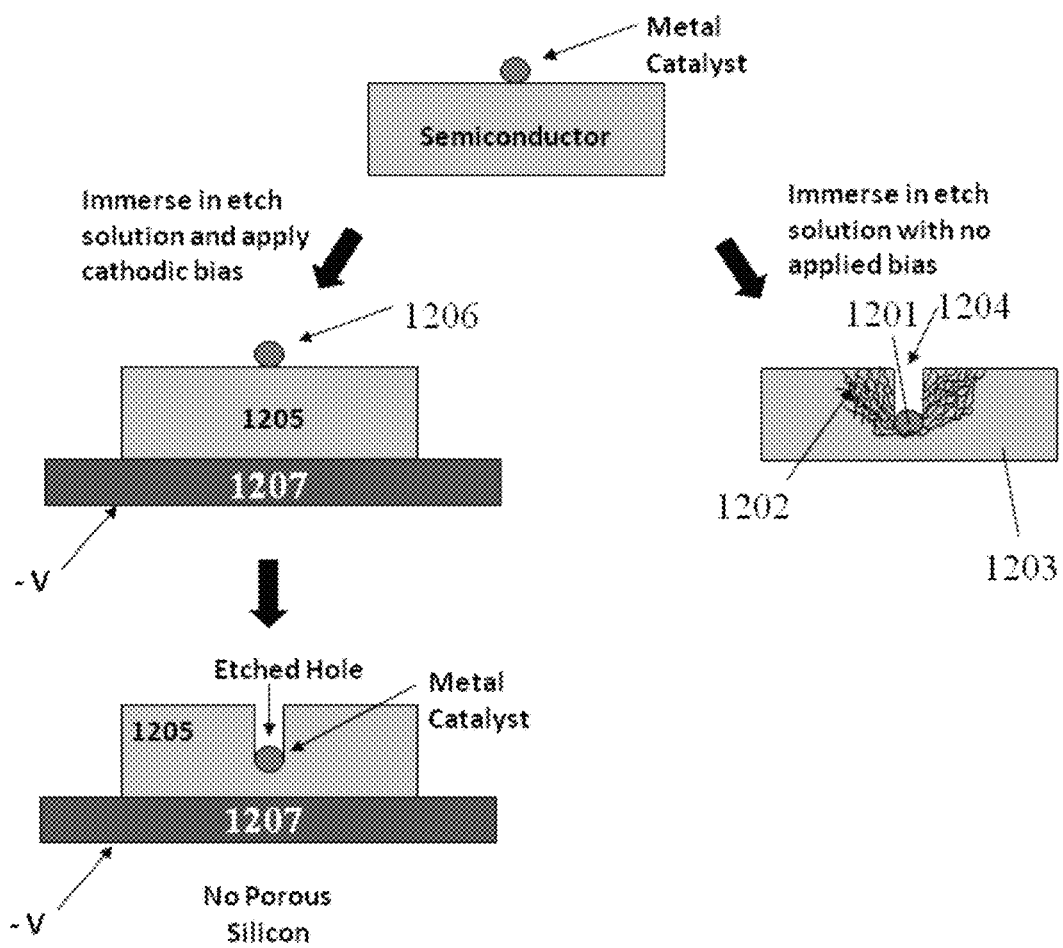
FIG. 12 schematically illustrates a method for forming holes in or wires from a semiconductor substrate with (right) or without (left) secondary pores, in accordance with an embodiment of the present disclosure.

Metal assisted etching of a semiconductor substrate can produce pores in the substrate near the vicinity of the etched region. The pores can be along the direction of etching to form holes in or wires from the substrate ("primary holes"). In addition, pores may be formed in other directions ("secondary pores"). Such secondary pores may be formed along a direction that is not parallel to the direction of etching. For example, secondary pores can be formed along a direction that is perpendicular to the orientation of the holes or wires. With reference to FIG. 12 (right), during etching using a metal catalyst 1201, porous silicon 1202 is formed in the silicon substrate 1203. The porous silicon 1202 includes secondary pores. Etching of the silicon substrate 1203 also forms primary pores 1204.

The porosity of a thermoelectric element, including the density of secondary pores, may be detrimental to the electrical performance of a thermoelectric device, such as, for example, in cases in which the secondary holes are electrically insulating. In some cases, secondary pores may be used to provide a given thermoelectric property. The density of pores (i.e., porosity), including the density of secondary pores, may be controlled with the aid of cathodic protection. Cathodic protection can be performed by supplying electrons to the semiconductor to control etching, including minimizing or preventing the formation of secondary pores.

In cathodic protection, a metal assisted etch of a semiconductor (e.g., see FIGS. 11A-11C) can result in etching of the semiconductor below the metal catalyst, but the porosity in the vicinity of the etched region can be controlled (e.g., eliminated) due to the application of a cathodic current to the semiconductor substrate. In FIG. 12 (left), during etching of a semiconductor substrate 1205 using a metal catalyst 1206, a potential or bias (e.g., direct current bias, −V) is applied to the substrate using an underlying electrode 1207. This can result in the semiconductor substrate having an etched pattern of holes or nanowires, depending on the staring metal pattern. The density of primary and secondary pores can be controlled by adjusting the potential bias. In some cases, the semiconductor substrate 1205 includes primary pores but little to no secondary pores, and may thus not be porous. As a result of cathodic protection, the semiconductor retains its electrical performance. In some examples, by employing an applied bias, the porosity observed in FIG. 12 (right) is reduced, if not eliminated.

Porosity can be controlled by applying a potential to the semiconductor substrate during metal-assisted etching. The potential can be, for example, at least about −0.01 V, −0.02 V, −0.03 V, −0.04 V, −0.05 V, −0.06 V, −0.07 V, −0.08 V, −0.09 V, −0.1 V, −0.2 V, −0.3 V, −0.4 V, −0.5 V, −0.6 V, −0.7 V, −0.8 V, −0.9 V, −1.0 V, −2.0 V, −3.0 V, −4.0 V, −5.0 V, −10 V, −20 V, −30 V, −40 V, or −50 V relative to ground.

The potential can be DC or AC, or a combination of DC and AC potentials. Use of an AC bias with DC offset can provide control over the etch rate using the DC bias and control over ions using the AC bias. The AC bias can alternately enhance and retard the etch rate.

During the period in which the substrate is etched, the electrical potential can be constant, varied or pulsed. In an example, the electrical potential is constant during the etching period. In another example, the electrical potential is pulsed on and off during the etching period. In another example, the electrical potential is varied during the etching period, such as varied gradually from a first value to a second value, which second value can be less than or greater than the first value. The electrical potential can then be varied from the second value to the first value, and so on.

An electrical potential can be applied with no electrical contact made to the substrate, but with the substrate placed between external conductive plates that have been energized with an external DC bias. The DC bias can be used to direct catalytically generated electron holes to the actively etched front surface or to the back surface of the substrate. This can be used to manipulate the front surface etch rate by directing excess electron holes to the back surface which is sacrificially etched.

An electrical potential can be applied continuously or discontinuously while catalytically etching a semiconductor substrate. In some situations, the electrical potential is applied continuously while exposing the substrate and a metal catalyst adjacent to the substrate to the oxidizing agent and the chemical etchant. As an alternative, the electrical potential is applied intermittently while exposing the substrate and a metal catalyst adjacent to the substrate to the oxidizing agent and the chemical etchant. Such intermittent application of the electrical potential can be every at least 0.1 seconds, 1 second, 10 seconds, 30 seconds, 1 minute, or 10 minutes, with gaps in between. During the gaps, an electrical potential is not applied, or the magnitude of the applied potential is decrease to less than or equal to about 80%, 70%, 60%, 50%, 40%, 30%, 20%, 10%, 5%, or 1% of the maximum applied potential (during non-gap periods). The gaps can have durations of at least about 0.1 seconds, 1 second, 10 seconds, 30 seconds, 1 minute, or 10 minutes.

The porosity of a semiconductor substrate during etching using an applied potential can provide a substrate having a primary pores to secondary pores at a ratio (primary to secondary) of at least about 1, 2, 3, 4, 5, 6, 7, 8, 9, 10, 20, 30, 40, 50, 60, 70, 80, 90, 100, 1000, or 10,000 to 1.

In some situations, the application of an electrical potential to a substrate and simultaneous exposure of the substrate to an oxidizing agent and a chemical etchant forms For example, a pattern of metal catalysts (e.g., silver) is formed adjacent to a silicon substrate using the methods described elsewhere herein. Next, a potential of −1 V is applied to the silicon. The metal catalyst is then exposed to an oxidizing agent and a chemical etchant, such as, for example, $H_2O_2$ and HF, respectively. This generates holes that are orthogonal to a top surface of the silicon substrate, but little to no secondary holes.

In some cases, the bias applied to the semiconductor substrate can be changed during the formation of holes in, or wires from, the substrate to regulate the porosity of the semiconductor substrate, including the density and location of secondary holes in the semiconductor substrate.

In some situations, the application of an electrical potential to a semiconductor substrate during catalytic etching can provide for a given etch rate. In some examples, exposing a metallic material adjacent to a semiconductor substrate to an oxidizing agent and a chemical etchant while applying a potential across the semiconductor substrate can etch the substrate at an etch rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s at 25° C. In some cases, the etch rate may be lower at elevated temperatures.

In an example, a patterned substrate is loaded into reaction space provided with up to five or more electrode connections. One of the electrodes is in ohmic contact with the substrate backside (the working electrode) and is isolated from an etchant electrolyte. Another electrode (the counter electrode) is submerged in the electrolyte but not in direct contact with the substrate, and used to supply current through the electrolyte to the substrate working electrode. Another electrode (the reference electrode) is immersed in the electrolyte and isolated from both the working and counter electrodes, in some cases using a frit, and used to sense the operating potential of the etch cell using a known or predetermined reference standard. Another two or more electrodes may be placed outside the reaction space in order to set up an external electric field.

The reaction space can be used in a number of ways. In one approach, the reaction space can be used in a two-electrode configuration by passing an anodic current via the substrate backside through a suitable electrolyte. The electrolyte can be, for example, a liquid mixture containing a diluent, such as water, or a fluoride-containing reagent, such as hydrofluoric acid, or an oxidizer, such as hydrogen peroxide. The electrolyte can include surfactants and/or modifying agents. The working potential can be sensed during anodization using the counter electrode in a three-electrode configuration. The anodization can be performed in the presence of a DC or AC external field using the electrodes placed outside the reaction space.

Doping

Another aspect of the present disclosure provides methods chemically doping of lightly doped or intrinsic semiconductor wafers (or substrates) after metal-assisted etching. In an example, a lightly doped n-type or p-type silicon substrate or intrinsic silicon substrate can be doped to a higher concentration of an n-type or p-type dopant.

Figure 13:
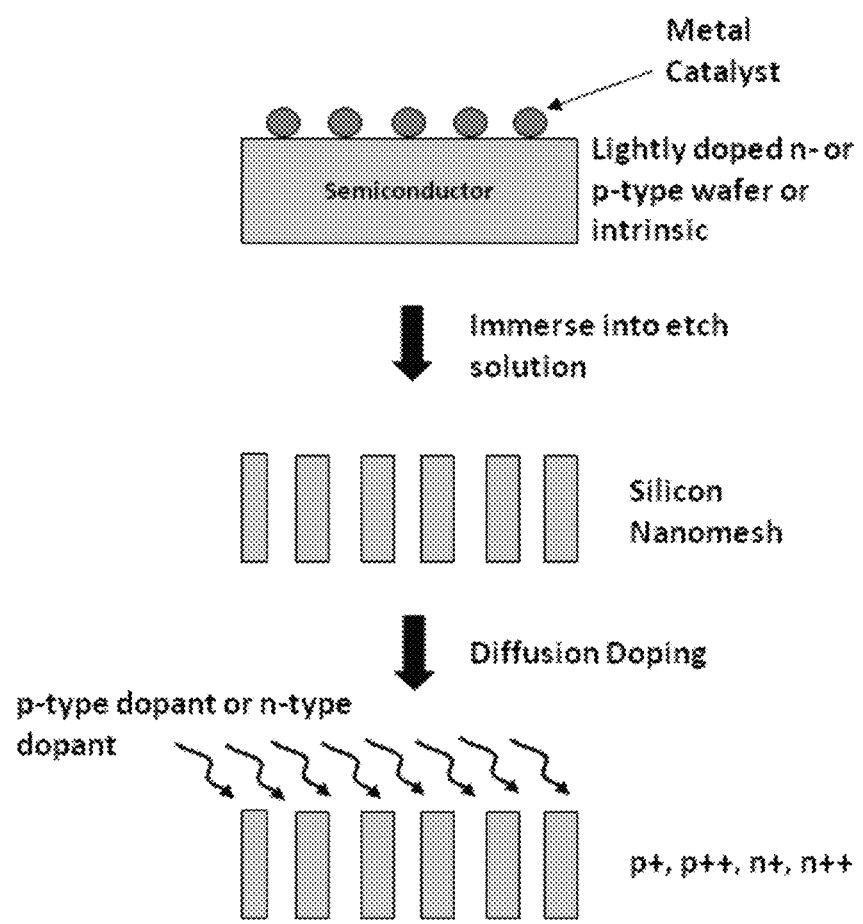
FIG. 13 schematically illustrates a method for doping a semiconductor substrate subsequent to forming holes in, or wires from, the substrate, in accordance with an embodiment of the present disclosure.

With reference to FIG. 13, a lightly doped (e.g., p-type of n-type) or intrinsic semiconductor substrate is initially patterned with a metal and etched using metal assisted etching to make nanowires or a holes in the semiconductor, as described elsewhere herein (see, e.g., FIG. 11A-11C). The semiconductor substrate is then doped with a p-type dopant or an n-type dopant to tune or otherwise adjust the electrical conductivity of the semiconductor substrate. The semiconductor substrate can then be used as a thermoelectric element.

In some examples, a semiconductor substrate can be doped by diffusion doping or ion implantation, or modulation doping. During diffusion doping, an n-type chemical precursor (e.g., phosphene, $POCl_3$) or a p-type chemical precursor (e.g., borane, BN, $BBr_3$) from a vapor phase, liquid or solid source can be supplied into a reaction space containing the semiconductor substrate and brought in contact with the semiconductor substrate. As an alternative, or in addition to, the semiconductor substrate can be doped using ion implantation in which dopant atoms are injected into the semiconductor substrate. In an example, during ion implantation, ions of a material (e.g., $NH_3$ or $B_2H_6$) are accelerated in an electrical field and impacted into the semiconductor substrate. Another alternative is modulation doping, which can be carried out using by depositing a film containing electrical carriers onto the semiconductor substrate. The film can be deposited by various deposition techniques, such as chemical vapor deposition or physical vapor deposition.

In the example of FIG. 13, doping is used to form a p-type (p, p+, p++) or n-type (n, n+, n++) semiconductor substrate following the formation of holes in, or wires from, the substrate.

Ion Milling

Another aspect of the disclosure provides a metal patterning process for forming nanostructures in a semiconductor (e.g., silicon) substrate by depositing a catalyst metal film adjacent to a semiconductor substrate, defining a pattern of features in the catalyst metal film, and catalytically etching the semiconductor substrate using the catalyst metal film to transfer the pattern to the substrate. Such an approach can be used to form holes in, or wires from, the semiconductor substrate.

In some embodiments, in a first operation, a catalyst metal film is deposited on a semiconductor wafer. The semiconductor wafer may be cleaned prior to deposition of the metal film, such as using piranha. Next, a semiconductor oxide film, such as using piranha. Next, a semiconductor oxide film, such as using piranha. Next, a semiconductor oxide (e.g., $SiO_2$) layer is deposited on the metal film. The semiconductor oxide layer can serve as a surface that is amenable to accepting a template having a polymer (see above). The semiconductor oxide layer can also serve as a pattern transfer resist. Next, a template is provided on the silicon oxide layer and a pattern of cylinders is formed in the template. The cylinders may be formed of a block copolymer, as described elsewhere herein. The cylinders are then removed to provide holes in the template. The holes expose the silicon oxide. A masking (or etch block) metal, such as, for example, chromium (Cr), tungsten (W), and/or titanium (Ti), is then deposited in the holes, and the template is removed. Portions of the silicon oxide layer not protected by the masking metal are then removed with the aid of an etching chemistry, such as a selective anisotropic etch (e.g., reactive-ion etching (RIE) plasma etch with $CF_4$, $CHF_3$, $C_4F_8$, or similar chemistries). This forms pillars of silicon oxide (e.g., $SiO_2$) atop the catalyst metal film. The pillars can serve as an etch mask for a subsequent ion-milling step—using, for example, RIE plasma etch with Ar—to transfer the pattern into the catalyst metal layer. Next, any remaining silicon oxide is removed by contacting the substrate with an etching chemistry (e.g., HF) to produce a pattern of catalyst metal particles on the semiconductor substrate. The pattern can be subsequently transferred to the semiconductor substrate, as described elsewhere herein (see, e.g., FIGS. 11A-11C). For example, the pattern can be transferred to the semiconductor substrate by exposing the catalyst metal layer to an oxidizing agent and a chemical etchant, such as $H_2O_2$ and HF, respectively.

In some examples, RIE is used to etch the semiconductor oxide and the catalyst metal layer. RIE can involve generating a plasma of a gas (e.g., Ar) under low pressure (vacuum) by an electromagnetic field to generate high energy ions from the gas, and directing the high energy ions from the plasma to an exposed surface, such as an exposed surface of the semiconductor oxide. The high energy ions can be directed to the surface under an applied electric field.

Figure 15:
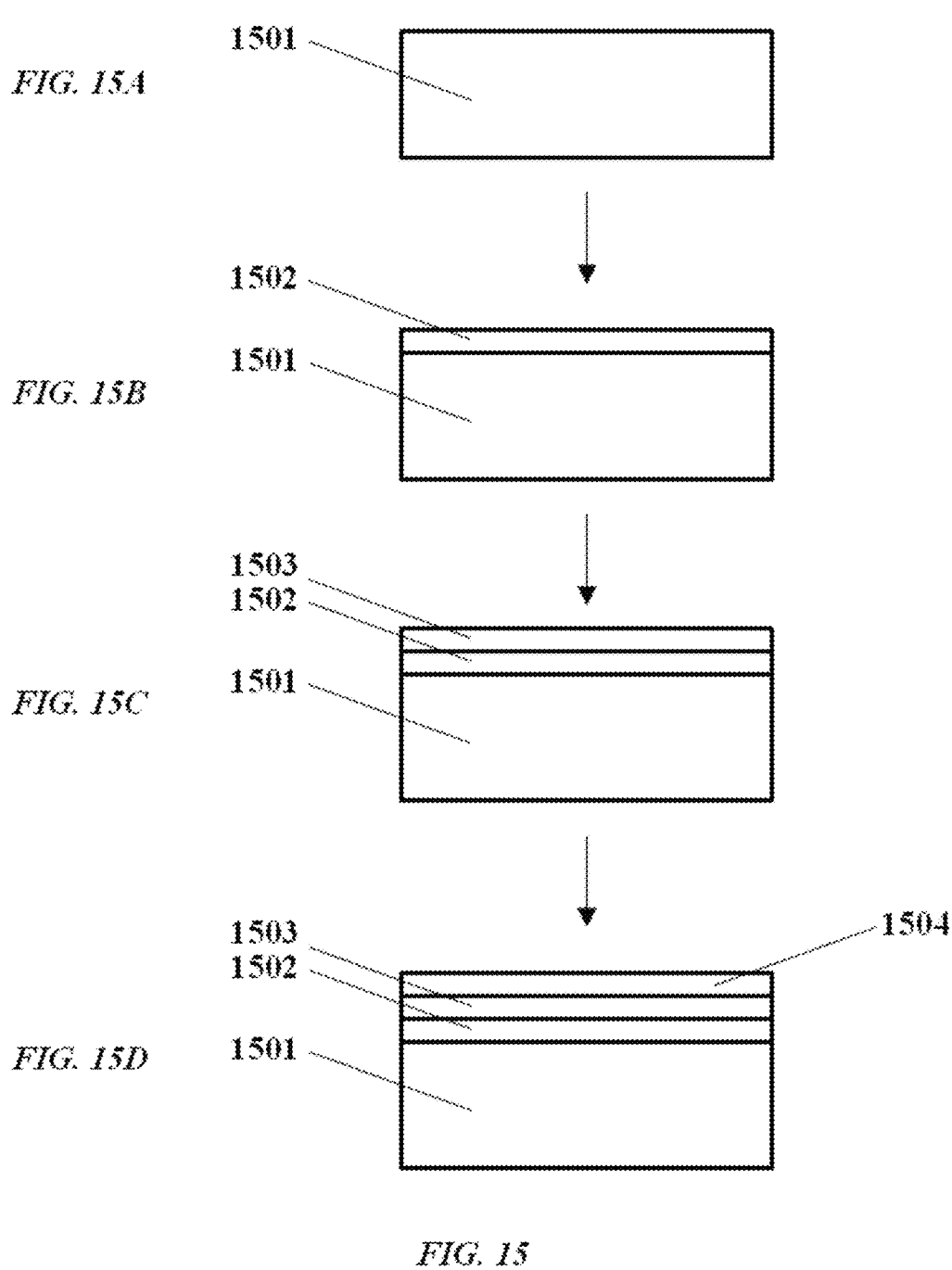
FIGS. 15A-15J shows various stages of an ion milling method for forming a thermoelectric element, in accordance with the present disclosure.
Figure 15:
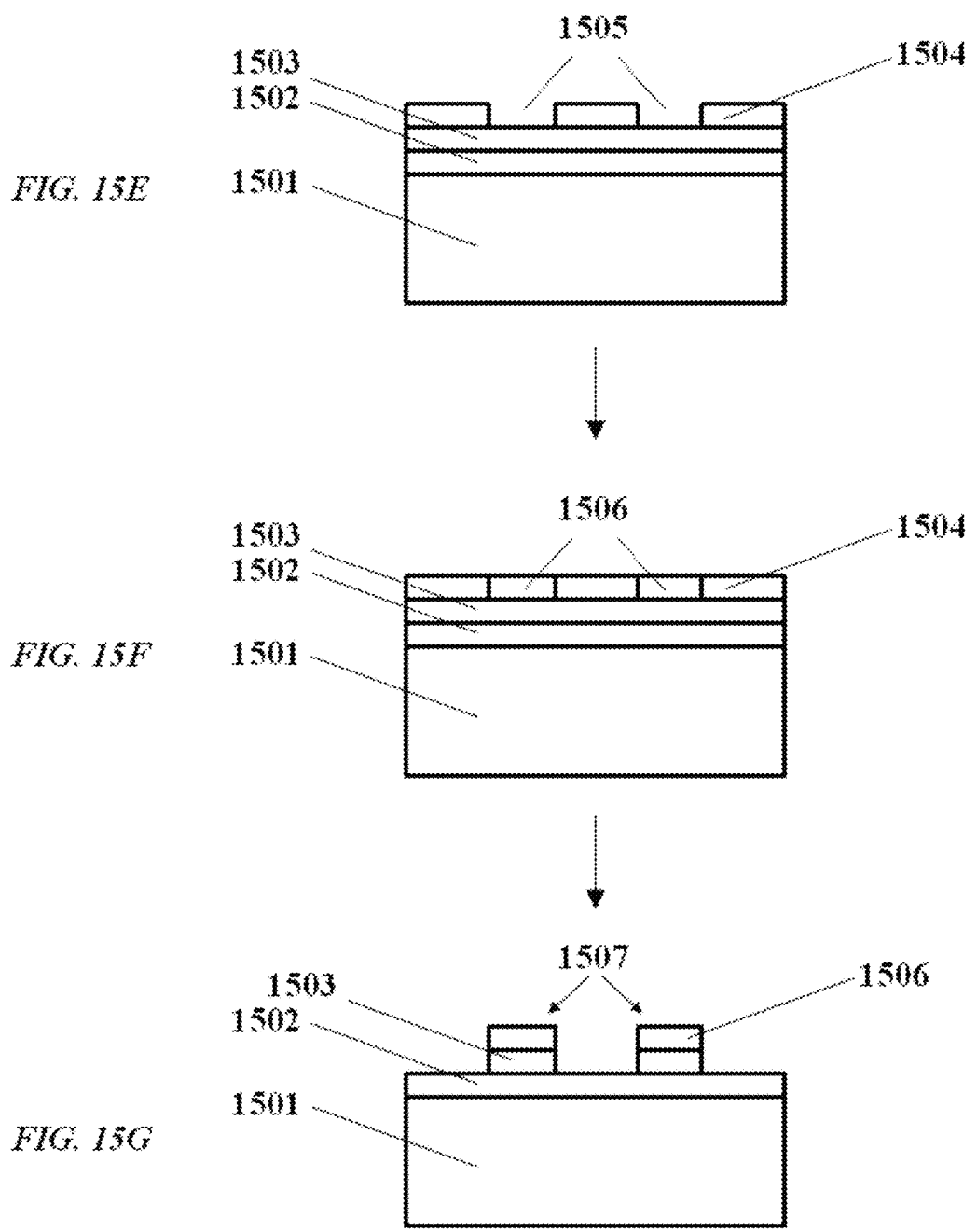
Figure 15:
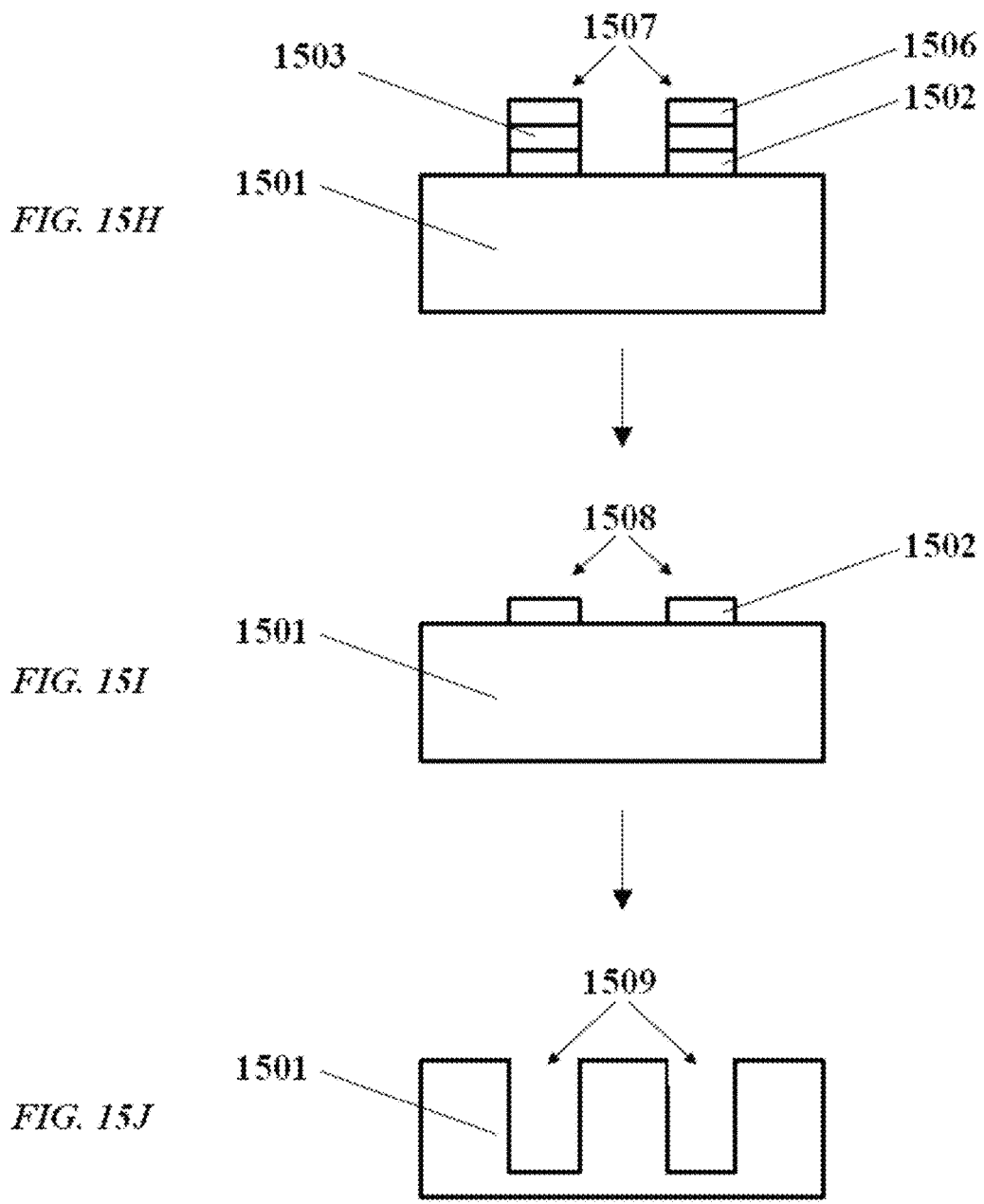

FIG. 15 schematically illustrates a process for forming holes in a semiconductor substrate 1501. FIGS. 15A-15J show various stages of formation of the holes. The holes can be nanoholes. The semiconductor substrate 1501 can be formed of any semiconductor material, such as a Group III-V (e.g., Ga—As) or Group IV (e.g., Si or Ge) semiconductor or combination of semiconductors.

With reference to FIG. 15A, the substrate 1501 is initially cleaned. A first layer 1502 of an etching material is then deposited on an exposed surface of the substrate 1501 (FIG. 15B). The etching material can be a catalyst material. The catalyst metal can be selected from any metals described above or elsewhere herein, such as gold, silver, platinum, chromium, molybdenum, tungsten and palladium. The first layer 1502 can be deposited using vapor phase deposition, such as physical vapor deposition (PVD), chemical vapor deposition (CVD), or atomic layer deposition (ALD), or variants thereof, such as plasma enhanced variants.

Next, with reference to FIG. 15C, a second layer 1503 of a semiconductor oxide (e.g., silicon oxide) or semiconductor nitride (e.g., silicon nitride) is deposited over the first layer 1502. The second layer 1503 can be deposited using various vapor phase deposition techniques, such as CVD or ALD. In an example, the second layer 1503 is formed of silicon oxide, which can be formed by exposing the first layer 1502 to a silicon source gas (e.g., $SiH_4$) and oxygen source gas (e.g., oxygen) at a substrate temperature of about 400° C.-450° C.

In some situations, the second layer 1503 is formed by varying the quantity of silicon source gas and the oxidizing agent. To enhance the adhesion between the first layer 1502 and the second layer 1503, the source feed can be temporarily starved of the oxygen source gas or nitrogen source gas for the first few seconds or minutes of deposition. Alternatively, or in addition to, the silicon source content of the gas feed can be temporarily increased during the same duration. The increased silicon content of the resulting deposited material can enhance the adhesion of the second layer 1503 to the first layer 1502. After the initial deposition, the ratio of the oxygen/nitrogen source feed to the silicon source feed can be restored to a setting for the targeted purpose or property (e.g., stoichiometry, film stress, etc). This approach can form a designed semiconductor oxide or dielectric material that combines preferable adhesion.

In some cases, an adhesive metal layer of a more adhesive metal (e.g., titanium, chromium, aluminum), as compared to the metal of the etching material in the first layer 1502, is deposited over the first layer 1502 before depositing the second layer 1503. The second layer 1503 may be formed of a noble metal or an alloy of noble metals. The adhesive metal layer can cap the first layer 1502, and the second layer 1503 is then deposited adjacent to the adhesive metal layer. The adhesive metal layer can provide enhanced contact or adhesion to the second layer 1503.

Next, a photoresist layer 1504 is deposited on the second layer 1503 (FIG. 15D) and subsequently patterned (FIG. 15E) to include a pattern of holes 1505. The photoresist can be provided by spin coating the photoresist layer 1504 layer on the second layer 1503. The holes 1505 can be formed by exposing the photoresist layer 1504 to electromagnetic radiation through a pattern (or reticle), and performing a wash to remove exposed portion of the photoresist layer 1504.

Next, an etch block material 1506 is deposited in the holes 1505, as shown in FIG. 15F. The etch block material 1506 can be selected such that it is resistive to etching with respect to the material of the second layer 1503. The etch block material 1506 can be a metal, such as chromium, tungsten, molybdenum, tungsten, titanium, niobium, or a combination thereof. The etch block material 1506 can be deposited by vapor phase deposition, such as PVD. Examples of PVD deposition include sputtering. Any etch block material 1506 that may deposit on the photoresist layer 1504 may be removed by an isotropic etch or chemical mechanical planarization (CMP), for example.

Next, the photoresist layer 1504 and the second layer 1503 are etched down to the first layer 1502, as shown in FIG. 15G. The photoresist layer 1504 and the second layer 1503 can be etched using a selective anisotropic etch, such as, for example, a plasma etch with $CF_4$, $CHF_3$, $C_4F_8$, or similar chemistries. This forms pillars 1507 on top of the first layer 1502. The pillars 1507 comprise the etch block material 1506 and a portion of the second layer 1503. Next, with the pillars serving as an etch mask, the first layer 1502 is etched to provide the structure of FIG. 15H. In some examples, the first layer 1502 is etched using ion milling. Ion milling can involve directing ions (e.g., Ar+) at a surface, in some cases under an applied electric field that directs the ions to the surface. In an example, the first layer 1502 is etched using a reactive-ion etching with Ar. This can permit the first layer 1502 to be etched at a higher rate than the pillars 1507. Etching the first layer 1502 selectively with respect to the pillars 1507 transfers the pattern of holes 1505 to the first layer 1502. This provides a pattern of pillars 1507 comprising the etch block material 1506 and portions of the second layer 1503 and first layer 1502, as shown in FIG. 15H.

Next, with reference to FIG. 15I, the substrate 1501 is exposed to an etching chemistry to remove the etch block material 1506 and the second layer 1503 from the pillars 1507. This yields particles 1508 of the catalyst metal from the first layer 1502 adjacent to the substrate 1501. The particles 1508 are distributed in a pattern that may be determined by the pattern of holes 1505. The etching chemistry can be an acid etch, such as HF or HI.

With reference to FIG. 15J, the catalyst metal is then used to catalytically etch the substrate 1501 to form holes 1509 in the substrate 1501. The holes 1509 may be in a pattern that is determined by the pattern of holes 1505. In some examples, the substrate 1501 can be etched by exposing the catalyst metal of the particles 1508 to an oxidizing agent and a chemical etchant, such as $H_2O_2$ and HF, respectively. In some situations, a potential bias is applied across the substrate 1501 during etching, as described elsewhere herein (e.g., FIG. 12 and corresponding text).

The pattern of holes 1505 and the dimensions of the holes can be selected to provide a predetermined distribution of holes 1509 in the substrate 1501. The pattern of holes 1505 can be monodisperse, which can provide a pattern of holes 1509 in the substrate 1501 that is monodisperse. The holes 1509 can have aspect ratios of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more. The aspect ratios can be provided by regulating the etching rate, etching time and directionality of the substrate 1501.

As an alternative, the etch block material 1506 is precluded to form a pattern of wires in the substrate 1501. In some examples, following formation of the photoresist layer 1504 and subsequent formation of holes 1505, the exposed second layer 1503 can be etched down to the first layer 1502 using a selective anisotropic etch, such as, for example, a plasma etch with $CF_4$, $CHF_3$, $C_4F_8$, or similar chemistries. Next, the first layer 1502 is etched down to the substrate 1501. In some examples, the first layer 1502 is etched using ion milling, as described above. This provides a pattern of holes in the first layer 1502. Any photoresist or material of the second layer 1503 can be removed, such as using CMP or a plasma comprising trifluoromethane. The pattern of holes in the first layer 1502 can then exposed to an oxidizing agent (e.g., $H_2O_2$) and a chemical etchant (e.g., HF, HI, HBr, or HCl) to form wires from the substrate 1501. The wires can be nanowires.

In some cases, the chemical etchant is combined with a salt, such as KF or NaCl, which can change the concentration of a solution containing the salt. The addition of a salt can increase etch speed, improve etch depth, and decrease secondary porosity by altering mass transport properties of etch reactants and byproducts. A salt can be selected to complement the chemical etchant. For example, if the chemical etchant is HF, the salt can be KF, and if the chemical etchant is HCl, the salt can be NaCl.

The concentration of the chemical etchant with respect to the oxidizing agent can be varied during etching. For example, concentration of hydrofluoric acid (HF) and/or hydrogen peroxide ($H_2O_2$) can be increased or decreased gradually to control etching directions and speed. In addition, additives, such as fluoride salts, can be added gradually to the etching solution. The etching speed and direction can also be controlled by gradual change of the etching solution temperature during the etching. The addition of a fluoride salt, for instance, can enhance etching speed. The decrease of the concentration of the chemical etchant with respect to the oxidizing agent can decrease the etching rate.

A pattern of holes or wires may have a pitch (e.g., center-to-center spacing between adjacent holes or wires) that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of holes or wires can have a roughness, as measured by transmission electron microscopy (TEM), between about 0.5 nm and 50 nm, or 1 nm and 20 nm, or 1 nm and 10 nm.

At least a fraction of a catalyst material may be deposited on the exposed surfaces of holes or wires. This may be the case if, for example, a residual amount of the metallic materials (or residue) remain after removal of the catalyst material. In some cases, the fraction of metallic material adsorbed on the exposed surfaces of the holes or wires, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by x-ray photoelectron spectroscopy (XPS). In other cases, however, the fraction of metallic material adsorbed on the exposed surfaces of the holes or wires, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the holes or wires, taken against the number of surface atoms on the exposed surfaces, is between about 0.000001% and 25%, as measured by XPS.

Substrates comprising a pattern of holes or wires can be chemically doped p-type or n-type and can be employed for use as thermoelectric elements. Substrates can be doped p-type or n-type subsequent to forming holes in or wires from the substrates, before forming the holes or wires, or while forming the holes or wires.

As an alternative, a sacrificial metal layer can be deposited on the substrate (e.g., silicon, silicon germanium, etc.) surface as an initial step. Then, a layer of a photoresist is provided adjacent to the sacrificial metal layer and a template is formed through the layer of the photoresist through, for example, nano-imprinting, block copolymer lithography, photolithography, e-beam lithography, etc. See, e.g., PCT/US2013/021900 to Boukai et al, which is entirely incorporated herein by reference for all purposes. This exposes portions of the sacrificial metal layer. Next, a reactive ion etch is performed to remove exposed portions of the sacrificial metal sheet to expose portions of the substrate. A layer of an etching material is then deposited on exposed portions of the substrate, and the remainder of the sacrificial metal layer is removed by a selective wet etch that may not substantially etch the etching material. Next, the etching material is exposed to an oxidizing agent and a chemical etchant to form holes in the substrate.

As an alternative, the sacrificial metal layer can be precluded. A layer of a photoresist can be deposited adjacent to a substrate and exposed to define a pattern of holes. Exposed portions of the photoresist can be removed (e.g., by a wash) to provide holes in the photoresist that expose portions of the substrate. An etching material can then be deposited on exposed portions of the substrate. The photoresist can then be removed (e.g., with a solvent or an ozone or oxygen containing plasma). In some examples, removal of the photoresist can be accelerated by partial removal of the photoresist, such as by exposure to ozone or oxygen-containing plasma, which can reduce liftoff times from several hours to minutes or seconds. The etching material can then be exposed to an oxidizing agent and a chemical etchant to form holes in the substrate. During etching with an oxidizing agent and a chemical etchant, an electrical potential (e.g., negative potential) can be applied across the substrate.

Another aspect of the present disclosure provides methods for fabricating metal catalyst particles adjacent to the surface of a semiconductor substrate (e.g., silicon), which can be used to form holes in, or wires from, the semiconductor substrate. In a first step, a polymer film is provided adjacent to the semiconductor substrate. The polymer film can be deposited or spin coated onto the semiconductor surface. The polymer film can be as described above or elsewhere herein.

Next, a pre-patterned mold with nanoscale features is pressed against the polymer film. The pre-patterned mold can include a pattern of pillars or holes. The pre-patterned mold can be brought in contact with the polymer film and pressed against the polymer film to deliver the pattern of features to the polymer film. The mold can deform the polymer film only where the polymer film is in contact with the nanoscale features. This forms a pattern of features corresponding to the mold in the polymer film. An inverse replica of the mold can be transferred to the polymer surface after the mold is removed.

The patterned polymer film can expose the substrate. In some situations, the patterned polymer film includes holes that expose the substrate. As another example, the patterned polymer film includes wires and exposed portions of the substrate in-between the wires.

The polymer replica can be used as a lift-off resist to form a pattern of metal catalysts for subsequent etching into the semiconductor substrate or as the masking metal for an ion milling procedure, as described above or elsewhere herein. In an example, an etching material (e.g., silver) is deposited over the patterned polymer film to provide the etching material over the polymer film and in holes formed in the polymer film. Next, the polymer film and any etching material over the polymer film is removed, such as by CMP or etching using a plasma, such as a plasma comprising trifluoromethane. This leaves the etching material as particles adjacent to the substrate. Next, the etching material is exposed to an oxidizing agent and a chemical etchant to catalytically etch the substrate to form holes in the substrate. The holes can be nanoholes.

As an alternative, the polymer film includes wires. An etching material is deposited over the polymer film and exposed portions of the substrate. The polymer film is then removed (e.g., by CMP) and the etching material is exposed to an oxidizing agent and a chemical etchant to catalytically etch the substrate to form wires from the substrate. The wires can be nanowires.

While etching the substrate, an electrical potential can be applied to the substrate to regulate the etch rate of the substrate. The application of a potential across the substrate can etch the substrate at an etch rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s at 25° C. In some cases, the etch rate may be lower at elevated temperatures. The potential can be, for example, at least about −0.01 V, −0.02 V, −0.03 V, −0.04 V, −0.05 V, −0.06 V, −0.07 V, −0.08 V, −0.09 V, −0.1 V, −0.2 V, −0.3 V, −0.4 V, −0.5 V, −0.6 V, −0.7 V, −0.8 V, −0.9 V, −1.0 V, −2.0 V, −3.0 V, −4.0 V, −5.0 V, −10 V, −20 V, −30 V, −40 V, or −50 V relative to ground.

Control Systems

Methods described herein can be automated with the aid of computer systems having storage locations with machine-executable code implementing the methods provided herein, and one or more processors for executing the machine-executable code.

Methods or the present disclosure can be implemented using systems at low, ambient or high pressure. In some cases, thermoelectric elements are formed at low pressure, such as using a vacuum chamber. In other cases, thermoelectric elements are formed in air. Alternatively, thermoelectric elements can be formed in an inert gas (e.g., $N_2$, Ar, He) atmosphere.

Figure 16:
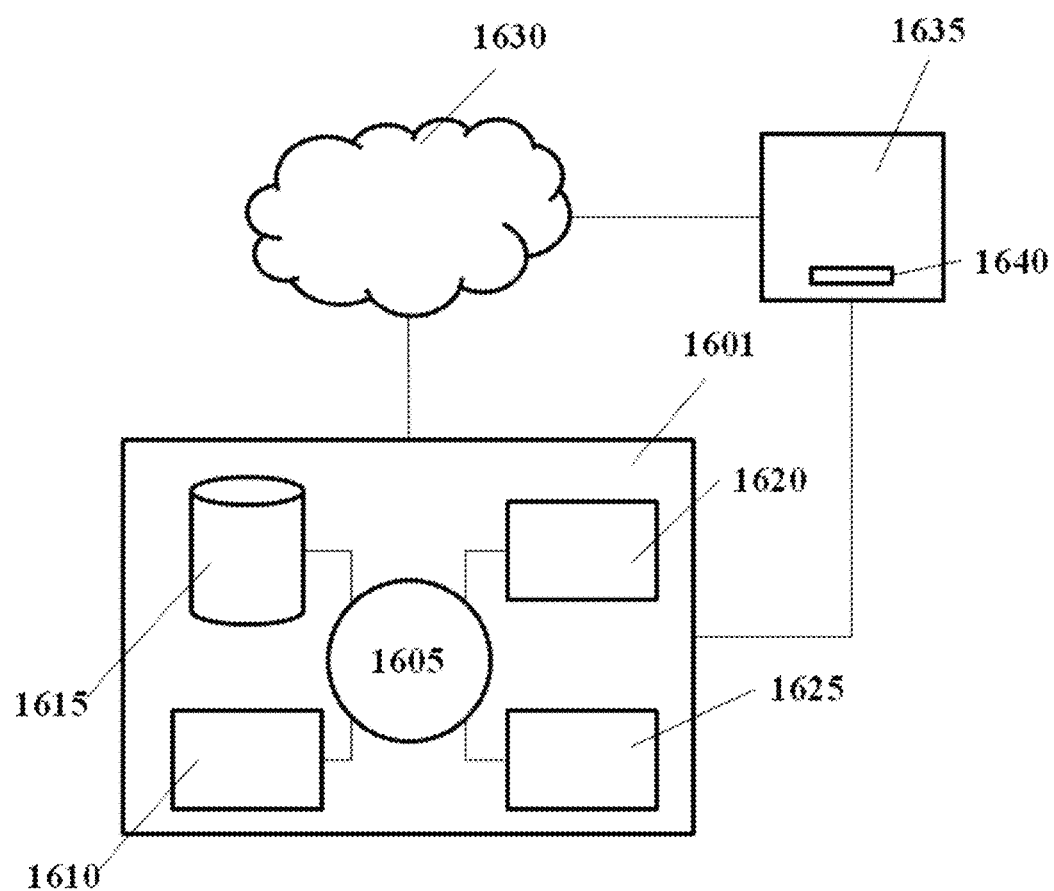
FIG. 16 schematically illustrates a computer system that is programmed or otherwise configured to implement the methods of the disclosure.

FIG. 16 shows a computer system (also "system" herein) 1601 programmed or otherwise configured to facilitate the formation of thermoelectric devices of the disclosure. The system 1601 can be programmed or otherwise configured to implement methods described herein. The system 1601 includes a central processing unit (CPU, also "processor" and "computer processor" herein) 1605, which can be a single core or multi core processor, or a plurality of processors for parallel processing. The system 1601 also includes memory 1610 (e.g., random-access memory, read-only memory, flash memory), electronic storage unit 1615 (e.g., hard disk), communications interface 1620 (e.g., network adapter) for communicating with one or more other systems, and peripheral devices 1625, such as cache, other memory, data storage and/or electronic display adapters. The memory 1610, storage unit 1615, interface 1620 and peripheral devices 1625 are in communication with the CPU 1605 through a communications bus (solid lines), such as a motherboard. The storage unit 1615 can be a data storage unit (or data repository) for storing data. The system 1601 is operatively coupled to a computer network ("network") 1630 with the aid of the communications interface 1620. The network 1630 can be the Internet, an internet and/or extranet, or an intranet and/or extranet that is in communication with the Internet. The network 1630 in some cases is a telecommunication and/or data network. The network 1630 can include one or more computer servers, which can enable distributed computing, such as cloud computing. The network 1630 in some cases, with the aid of the system 1601, can implement a peer-to-peer network, which may enable devices coupled to the system 1601 to behave as a client or a server.

The system 1601 is in communication with a processing system 1635 for forming thermoelectric devices of the disclosure. The processing system 1635 can be configured to implement various operations to form nanostructures (e.g., holes or wires) in a substrate 1640 in the processing system 1635, such directing an oxidizing agent and a chemical etchant to the substrate, when appropriate, to form holes in, or wires from, the substrate. The processing system 1635 can be in communication with the system 1601 through the network 1630, or by direct (e.g., wired, wireless) connection. In an example, the processing system 1635 is a vacuum chamber. In another example, the processing system 1635 is a dry box.

The processing system 1635 can include a reaction space for forming nanostructures (e.g., holes or wires) in the substrate 1640. The reaction space can be in fluid communication with various chemicals for forming the holes or wires. For example, the reaction space is in communication with a source of an oxidizing agent and a source of a chemical etchant.

The processing system 1635 can be a deposition system. The processing system 1635 can be configured to perform reactive-ion etching.

Methods as described herein can be implemented by way of machine (or computer processor) executable code (or software) stored on an electronic storage location of the system 1601, such as, for example, on the memory 1610 or electronic storage unit 1615. During use, the code can be executed by the processor 1605. In some examples, the code can be retrieved from the storage unit 1615 and stored on the memory 1610 for ready access by the processor 1605. In some situations, the electronic storage unit 1615 can be precluded, and machine-executable instructions are stored on memory 1610.

The code can be pre-compiled and configured for use with a machine have a processer adapted to execute the code, or can be compiled during runtime. The code can be supplied in a programming language that can be selected to enable the code to execute in a pre-compiled or as-compiled fashion.

Aspects of the systems and methods provided herein, such as the system 1601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

Methods described herein can be automated with the aid of computer systems having storage locations with machine-executable code implementing the methods provided herein, and a processor for executing the machine-executable code.

While various embodiments described herein have made reference to semiconductor substrates, methods described above may be employed for use with other types of substrates, such as substrates formed of metallic or insulating (dielectric) materials.

Unless the context clearly requires otherwise, throughout the description and the claims, the words 'comprise,' 'comprising,' and the like are to be construed in an inclusive sense as opposed to an exclusive or exhaustive sense; that is to say, in a sense of 'including, but not limited to.' Words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

Devices, systems and methods provided herein may be combined with or modified by other devices, systems and methods, such as devices, systems and/or methods described in U.S. Pat. No. 7,309,830 to Zhang et al., U.S. Patent Publication No. 2006/0032526 to Fukutani et al. U.S. Patent Publication No. 2009/0020148 to Boukai et al., and U.S. patent application Ser. No. 13/550,424 to Boukai et al. ("THERMOELECTRIC DEVICES, SYSTEMS AND METHODS"), each of which is entirely incorporated herein by reference.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for forming a thermoelectric device, comprising:
   (a) providing a semiconductor substrate;
   (b) providing a first layer of an etching material adjacent to said semiconductor substrate, wherein said etching material facilitates the etching of said semiconductor substrate upon exposure to an oxidizing agent and a vapor chemical etchant;
   (c) providing a second layer of a semiconductor oxide adjacent to said first layer;
   (d) patterning said second layer to form a pattern of holes or wires;
   (e) sequentially etching said second layer and said first layer to expose portions of said semiconductor substrate; and
   (f) contacting exposed portions of said semiconductor substrate to said oxidizing agent and said vapor chemical etchant while applying an electrical potential to said semiconductor substrate, to transfer said pattern to said semiconductor substrate.

2. The method of claim 1, wherein (d) comprises forming a pattern of holes.

3. The method of claim 2, further comprising, between (c) and (d):
   providing a third layer of an etch block material adjacent to said second layer; and
   patterning said third layer to form said pattern of holes.

4. The method of claim 3, wherein (e) further comprises etching said second and said first layer at a higher rate than said etch block material.

5. The method of claim 1, wherein said electrical potential is a negative potential bias applied across said semiconductor substrate.

6. The method of claim 1, wherein said oxidizing agent is selected from the group consisting of $O_2$, $O_3$, $NO_2$ and $H_2O_2$, and wherein said vapor chemical etchant is selected from the group consisting of HF, HCl, HBr and HI.

7. The method of claim 1, wherein in (e), said second layer and said first layer are etched by reactive-ion etching.

8. The method of claim 1, wherein (f) further comprises forming holes in or wires from said semiconductor substrate, which holes or wires have aspect ratios from about 100-to-1 to about 100,000,000-to-1.

9. The method of claim 1, wherein in (f) said semiconductor substrate is etched at a rate from about 0.1 nanometers/second to about 10,000 nanometers/second.

10. The method of claim 1, wherein (f) further comprises forming holes in or wires from said semiconductor substrate, which holes or wires have aspect ratios from about 2011:11-to-1 to about 100,000,000-to-1.

11. The method of claim 1, wherein (f) further comprises forming holes in or wires from said semiconductor substrate, and wherein surfaces of said semiconductor substrate exposed by said holes or wires have a roughness between about 0.5 nanometers (nm) and 50 nm across said holes or wires as measured by transmission electron microscopy.

12. The method of claim 1, wherein said thermoelectric device has a figure-of-merit from about 0.1 to about 2.5.

13. The method of claim 12, wherein said thermoelectric device has a figure-of-merit from about 0.1 to about 0.5.

14. The method of claim 2, wherein said pattern of holes comprises monodisperse holes.

15. The method of claim 3, wherein said etch block material comprises one or more metals.

16. The method of claim 15, wherein said etch block material comprises one or more of chromium, tungsten, molybdenum, tungsten, titanium, or niobium.

17. The method of claim 1, wherein said etching material comprises one or more metals.

18. The method of claim 17, wherein said etching material comprises one or more members selected from the group consisting of gold, silver, platinum, chromium, molybdenum, tungsten, and palladium.

* * * * *

UNITED STATES PATENT AND TRADEMARK OFFICE
CERTIFICATE OF CORRECTION

PATENT NO. : 10,003,004 B2
APPLICATION NO. : 14/700082
DATED : June 19, 2018
INVENTOR(S) : Akram I. Boukai et al.

Page 1 of 1

It is certified that error appears in the above-identified patent and that said Letters Patent is hereby corrected as shown below:

In the Claims

At Column 28, Lines 54-55, Claim 10, please change "2011:11-to-1" to --20-to-1--

Signed and Sealed this
Sixth Day of November, 2018

Andrei Iancu
*Director of the United States Patent and Trademark Office*